(12) United States Patent
Shiratsuchi et al.

(10) Patent No.: US 11,385,192 B2
(45) Date of Patent: Jul. 12, 2022

(54) INSPECTION APPARATUS AND INSPECTION METHOD

(71) Applicant: NuFlare Technology, Inc., Yokohama (JP)

(72) Inventors: Masataka Shiratsuchi, Kawasaki (JP); Riki Ogawa, Kawasaki (JP); Hiromu Inoue, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/907,925

(22) Filed: Jun. 22, 2020

(65) Prior Publication Data

US 2021/0010959 A1 Jan. 14, 2021

(30) Foreign Application Priority Data

Jul. 8, 2019 (JP) .............................. JP2019-127076

(51) Int. Cl.
*G01N 23/2251* (2018.01)
*H01J 37/30* (2006.01)
*H01J 37/317* (2006.01)

(52) U.S. Cl.
CPC ...... *G01N 23/2251* (2013.01); *H01J 37/3005* (2013.01); *H01J 37/3174* (2013.01); *G01N 2223/6116* (2013.01); *G01N 2223/646* (2013.01)

(58) Field of Classification Search
None
See application file for complete search history.

(56) References Cited

U.S. PATENT DOCUMENTS

| 8,369,602 | B2 * | 2/2013 | Yamaguchi | G06T 7/13 |
| | | | | 382/145 |
| 9,207,196 | B2 * | 12/2015 | De Jonge | H01J 37/20 |
| 2002/0122018 | A1 * | 9/2002 | Kanda | G09G 3/22 |
| | | | | 345/75.2 |
| 2007/0092129 | A1 * | 4/2007 | Sugiyama | H01J 37/222 |
| | | | | 382/145 |

(Continued)

FOREIGN PATENT DOCUMENTS

| JP | 2015-138710 A | 7/2015 |
| KR | 10-2014-0027508 | 3/2014 |
| KR | 10-2019-0009711 | 1/2019 |

OTHER PUBLICATIONS

Korean Office Action dated Aug. 30, 2021 in Korean Application No. 10-2020-0082672 with English machine translation, 9 pgs.

*Primary Examiner* — Andrew Smyth
(74) *Attorney, Agent, or Firm* — Oblon, McClelland, Maier & Neustadt, L.L.P.

(57) ABSTRACT

Provided is an inspection apparatus including: an irradiation source irradiating a first pattern formed on an inspection target object with an electron beam; a detection circuit acquiring a first inspection image generated from the first pattern by irradiation; a filter circuit performing smoothing using a local region having a first size in a direction parallel to a first outline included in the first inspection image and a second size smaller than the first size in a direction perpendicular to the first outline and acquiring a second inspection image including a second outline generated by the smoothing; and a comparison circuit comparing the second inspection image with a predetermined reference image.

18 Claims, 15 Drawing Sheets

(56) References Cited

U.S. PATENT DOCUMENTS

| | | | | |
|---|---|---|---|---|
| 2009/0263002 A1* | 10/2009 | Cremer | B82Y 20/00 | |
| | | | 382/133 | |
| 2010/0005130 A1* | 1/2010 | Oktem | G01N 23/046 | |
| | | | 708/446 | |
| 2010/0054565 A1* | 3/2010 | Quinto | G01N 23/046 | |
| | | | 378/4 | |
| 2012/0032077 A1* | 2/2012 | Matsumoto | H01J 37/28 | |
| | | | 250/307 | |
| 2013/0094029 A1* | 4/2013 | Bienstman | G01N 21/7746 | |
| | | | 356/517 | |
| 2015/0003725 A1* | 1/2015 | Wan | G06T 7/194 | |
| | | | 382/154 | |
| 2017/0221230 A1* | 8/2017 | Allinson | A61B 6/4258 | |
| 2017/0261533 A1* | 9/2017 | Woehl | G01Q 20/00 | |
| 2019/0228949 A1* | 7/2019 | Janssen | H01J 37/261 | |
| 2019/0294055 A1* | 9/2019 | Huisman | G03F 7/70625 | |
| 2020/0410666 A1* | 12/2020 | Wagner | A61B 6/50 | |

\* cited by examiner

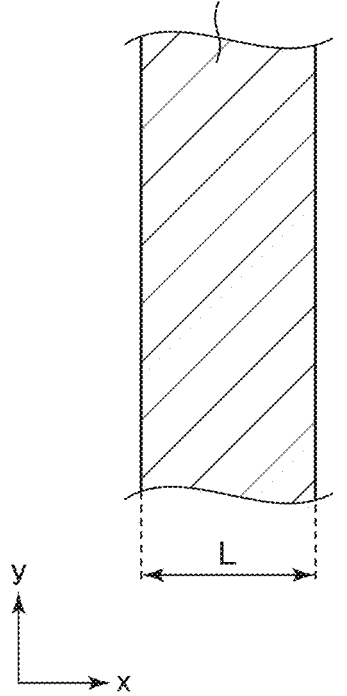
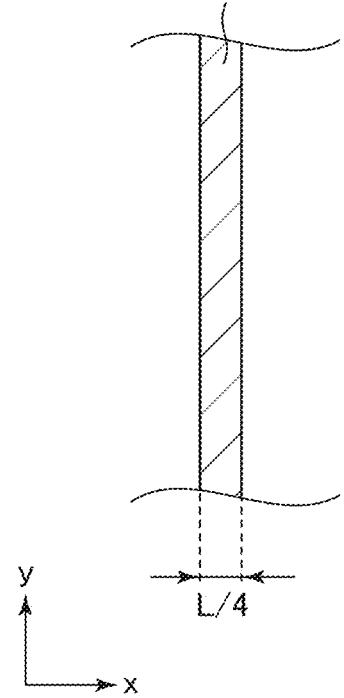
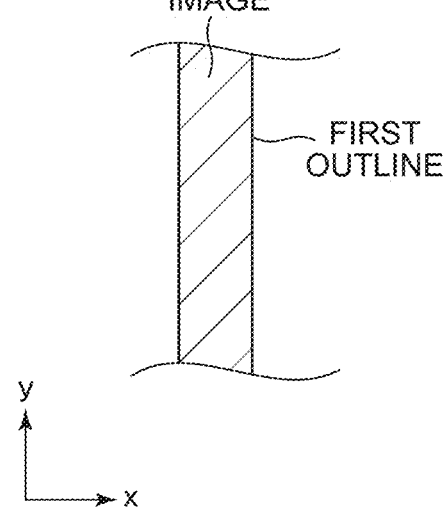

F(x,y,θ)

INSPECTION APPARATUS AND INSPECTION METHOD

CROSS-REFERENCE TO RELATED APPLICATION

This application is based upon and claims the benefit of priority from Japanese Patent Applications No. 2019-127076, filed on Jul. 8, 2019, the entire contents of which are incorporated herein by reference.

FIELD OF THE INVENTION

Embodiments relate to an inspection apparatus and an inspection method.

In recent years, circuit line widths required for semiconductor elements have become increasingly smaller with the increase in integration and capacity of large-scale integrated circuits (LSIs). These semiconductor elements are manufactured by using an original image pattern (also referred to as a mask or a reticle and, hereinafter, collectively referred to as a mask) on which a circuit pattern is formed and by exposing and transferring the pattern onto a wafer by a reduction projection exposing apparatus called a so-called stepper to form a circuit.

In addition, for the production of LSIs requiring a large production cost, the improvement of yields is indispensable. However, patterning dimensions of less than 20 nm have already been realized by liquid immersion exposure and multi-patterning technology, and furthermore, fine processing of patterning less than 10 nm has been realized by practical application of extreme ultraviolet (EUV) exposure. In addition, practical use of other fine processing techniques using an exposure such as a nanoimprinting lithography (NIL) and a directed self-assembly (DSA) lithography has also been progressing. In recent years, with the miniaturization of sizes of LSI patterns formed on semiconductor wafers, the sizes to be detected as pattern defects have become extremely small, and the number of patterns to be inspected even in the same area has also become large. Therefore, it is necessary to improve the accuracy and speed of an inspection apparatus for inspecting defects of ultrafine patterns transferred onto the semiconductor wafer. Besides, as one of the major factors of decreasing the yields, there may be mentioned a pattern defect of a mask used for exposing and transferring an ultrafine pattern on a semiconductor wafer by a photolithography technique. For this reason, it is necessary to improve the accuracy of the inspection apparatus for inspecting defects of a transfer mask, as well as wafers, used for manufacturing LSIs.

As the inspection method, there is known a method of performing an inspection by comparing an optical image obtained by imaging a pattern formed on an inspection target object by using a magnifying optical system at a predetermined magnification with design data or an optical image obtained by imaging the other identical pattern on an inspection target object. Here, the inspection target object is a mask of a lithography mask or the like and a wafer such as a semiconductor wafer, and so on. For example, as the inspection method, there are "die-to-die inspection" for comparing optical image data obtained by imaging the identical patterns at different locations on the same mask or "die-to-database inspection" for inputting writing data (design pattern data) converted into a device input format for a writing device to the inspection apparatus to generate design image data (reference image) on the basis of the data and comparing an optical image which is measurement data obtained by imaging the pattern with the design image data. In the inspection method in such an inspection apparatus, the inspection target substrate is mounted on a stage (target object stage), and by moving the stage, the light flux scans over the inspection target object to perform the inspection. The inspection target substrate is irradiated with the light flux by a light source and an illumination optical system. The light transmitted or reflected by the inspection target substrate is imaged on the sensor via the optical system. The images captured by the sensor are transmitted to a comparison circuit as measurement data. After the alignment of the images, the comparison circuit compares the measured data with the reference data according to an appropriate algorithm, and in a case where the data do not match, it is determined that there is a pattern defect.

In the above-described inspection apparatus, an optical image is acquired by illuminating the inspection target substrate with a laser light and capturing a transmission image or a reflection image thereof. The inspection apparatuses using the laser light, or the like have difficulty in detecting pattern shapes and defects with an accuracy of several tens of nanometers or less, and the resolution has become insufficient for ultra-fine pattern inspections in the recent years. On the other hand, there has been developed an inspection apparatus that irradiates the inspection target substrate with multiple beams including a plurality of electron beams in an array arrangement in which a plurality of columns of beams are arrayed at an equal pitch on a straight line are aligned, detects secondary electrons corresponding to the respective beams emitted from the inspection target substrate to acquire a pattern image. In an inspection apparatus using an electron beam including such multiple beams, secondary electrons are detected by scanning each small region of the inspection target substrate. If the electron beam is used, the resolution is improved, the pattern shapes and defects can be detected at an accuracy of nanometer order. However, the noise of the pattern images obtained using by electron beams is increased, and thus, even though the multiple beams are required in order to obtain an image having clear and high-quality pattern edge shapes, there is a problem in that the inspection time becomes very long.

SUMMARY OF THE INVENTION

According to an aspect of embodiments, there is provided an inspection apparatus including: an irradiation source irradiating a first pattern formed on an inspection target object with an electron beam; a detection circuit acquiring a first inspection image generated from the first pattern by irradiation; a filter circuit performing smoothing using a local region having a first size in a direction parallel to a first outline included in the first inspection image and a second size smaller than the first size in a direction perpendicular to the first outline and acquiring a second inspection image including a second outline generated by the smoothing; and a comparison circuit comparing the second inspection image with a predetermined reference image.

BRIEF DESCRIPTION OF THE DRAWINGS

FIGS. 6A to 6C are schematic diagrams of a photomask pattern, a pattern transferred onto a wafer, and a first inspection image according to the first embodiment;

DETAILED DESCRIPTION OF THE EMBODIMENTS

Hereinafter, embodiments will be described with reference to the drawings.

First Embodiment

An inspection apparatus according to the present embodiment includes: an irradiation source that irradiates a first pattern formed on an inspection target object with an electron beam; a detection circuit acquires a first inspection image generated from the first pattern by irradiation; a filter circuit that performs smoothing using a local region having a first size in a direction parallel to a first outline included in the first inspection image and a second size smaller than the first size in a direction perpendicular to the first outline and acquires a second inspection image including a second outline generated by the smoothing; and a comparison circuit that compares the second inspection image with a predetermined reference image.

According to embodiments, an inspection method includes: irradiating a first pattern formed on an inspection target object with an electron beam: acquiring a first inspection image generated from the first pattern by irradiation; performing smoothing using a local region having a first size in a direction parallel to a first outline included in the first inspection image and a second size smaller than the first size in a direction perpendicular to the first outline and acquiring a second inspection image including a second outline generated by the smoothing; and comparing the second inspection image with a predetermined reference image.

Figure 1:
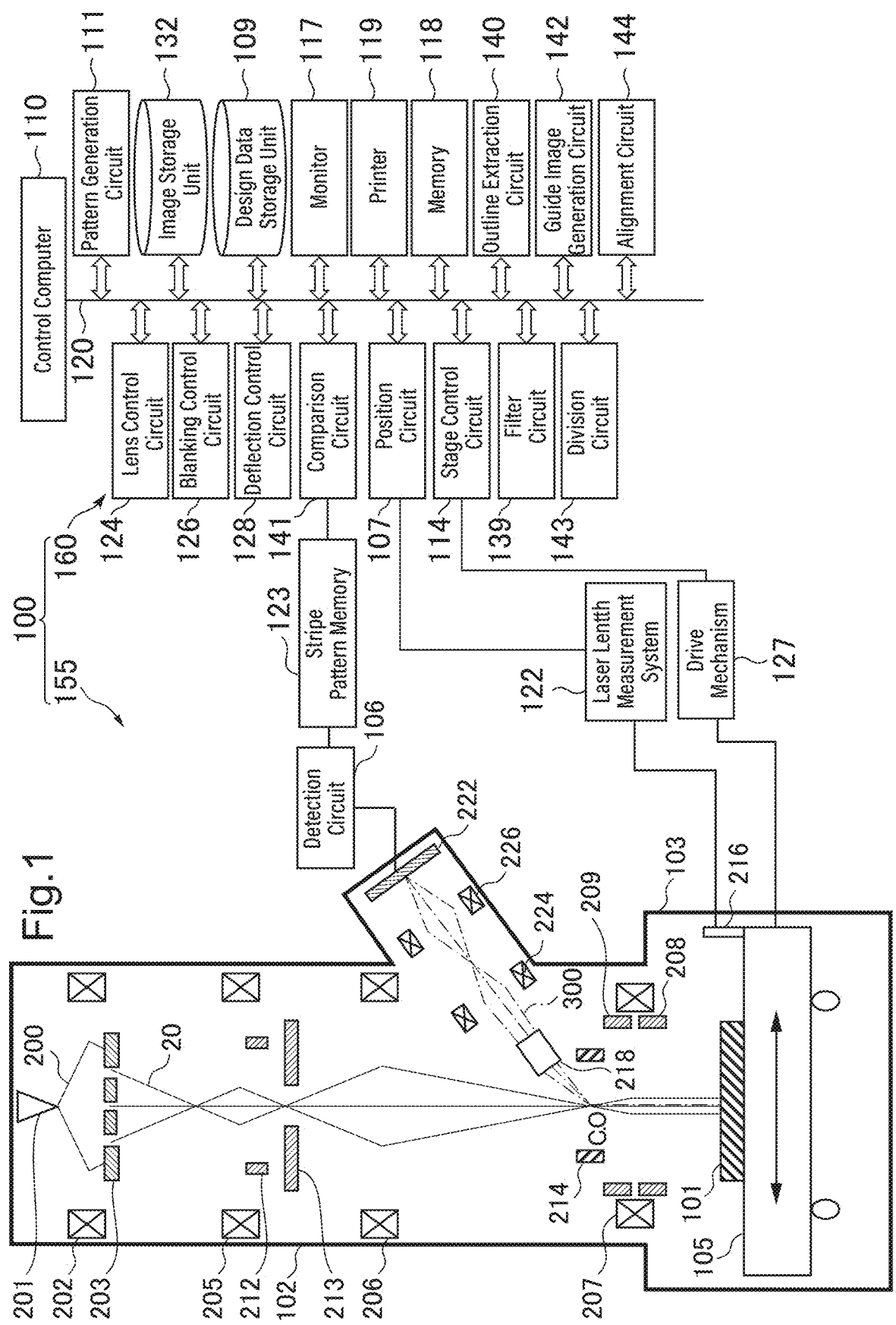
FIG. 1 is a schematic configuration diagram of an inspection apparatus according to a first embodiment.

FIG. 1 is a configuration diagram illustrating a configuration of an inspection apparatus according to the present embodiment. In FIG. 1, an inspection apparatus 100 for inspecting a pattern formed on a substrate is an example of a charged particle beam inspection apparatus. An electron beam is an example of a charged particle beam. The inspection apparatus 100 includes an electro-optical image acquisition mechanism (image acquisition mechanism) 155 and a control system circuit (control unit) 160. The electro-optical image acquisition mechanism (image acquisition mechanism) 155 includes an electron beam column (electron lens barrel) 102, an inspection room 103, a detection circuit 106, a stripe pattern memory 123, a drive mechanism 127, and a laser length measurement system 122. An electron gun assembly (irradiation source) 201, an electromagnetic lens 202, a shaping aperture array substrate 203, a reduction lens 205, an electromagnetic lens 206, an objective lens 207, a main deflector 208, a sub-deflector 209, a collective blanking deflector 212, a limited aperture substrate 213, a beam separator 214, electromagnetic lenses 224 and 226, and a multi-detector 222 are disposed in the electron beam column 102.

An XY stage (target object stage) 105 that can move at least on the XY plane is disposed in the inspection room 103. On the XY stage 105, a substrate (inspection target object) 101 on which a chip pattern to be inspected is formed is disposed. The substrate 101 is, for example, a silicon wafer or the like. The substrate 101 is disposed on the XY stage 105, for example, with the pattern formation surface facing upward. In addition, a mirror 216 that reflects a laser light for laser length measurement irradiated from the laser length measurement system 122 disposed outside the inspection room 103 is disposed on the XY stage 105. The multi-detector 222 is connected to the detection circuit 106 outside the electron beam column 102. The detection circuit 106 is connected to the stripe pattern memory 123.

In the control system circuit 160, the control computer 110 which is a computer is connected to a position circuit 107, a pattern generation circuit 111, a stage control circuit 114, a lens control circuit 124, a blanking control circuit 126, a deflection control circuit 128, an image storage unit 132, a filter circuit 139, an outline extraction circuit 140, a comparison circuit 141, a guide image generation circuit 142, a division circuit 143, an alignment circuit 144, a design data storage unit 109 such as a magnetic disk drive, a monitor 117, a memory 118, and a printer 119 via a bus 120. In addition, the XY stage 105 is driven by the drive mechanism 127 under the control of the stage control circuit 114. In the drive mechanism 127, for example, a drive system such as a three-axis (X-Y-θ) motor that drives in the X, Y, and θ directions is configured to allow the XY stage 105 to be movable. As these X motor, Y motor, and θ motor (not illustrated), for example, step motors can be used. The XY stage 105 is movable in the horizontal direction and the rotation direction by motors of X, Y, and θ axes. The moving position of the XY stage 105 is measured by the laser length measurement system 122 and supplied to the position circuit 107. The laser length measurement system 122 measures the position of the XY stage 105 on the basis of the principle of laser interferometry by receiving the reflected light from the mirror 216.

A high-voltage power supply circuit (not illustrated) is connected to the electron gun assembly 201, and thus, an acceleration voltage from the high-voltage power supply circuit is applied between a filament (not illustrated) in the electron gun assembly 201 and an extraction electrode. By the application with the predetermined voltage of the extraction electrode and heating of the cathode (filament) at a predetermined temperature, a group of the electrons emitted from the cathode are accelerated, and thus, an electron beam is emitted. As the reduction lens 205 and the objective lens 207, for example, the electromagnetic lenses are used, and both are controlled by the lens control circuit 124. In addition, the beam separator 214 is also controlled by the lens control circuit 124. The collective blanking deflector 212 is configured with an electrode group having at least two poles and is controlled by the blanking control circuit 126. Each of the main deflector 208 and the sub-deflector 209 is configured with an electrode group having at least four poles and is controlled by the deflection control circuit 128.

In a case where the substrate 101 is a semiconductor wafer on which a plurality of chip (die) patterns are formed, pattern data of the chip (die) patterns are input from an outside of the inspection apparatus 100 and stored in the design data storage unit 109. In addition, in a case where the substrate 101 is a photomask for exposure, design pattern data as a basis of the formation of a mask pattern on the photomask for exposure is input from the outside of the inspection apparatus 100 and stored in the design data storage unit 109.

Herein, FIG. 1 illustrates a configuration necessary for describing the present embodiment. The inspection apparatus 100 may generally have other necessary components.

Figure 2:
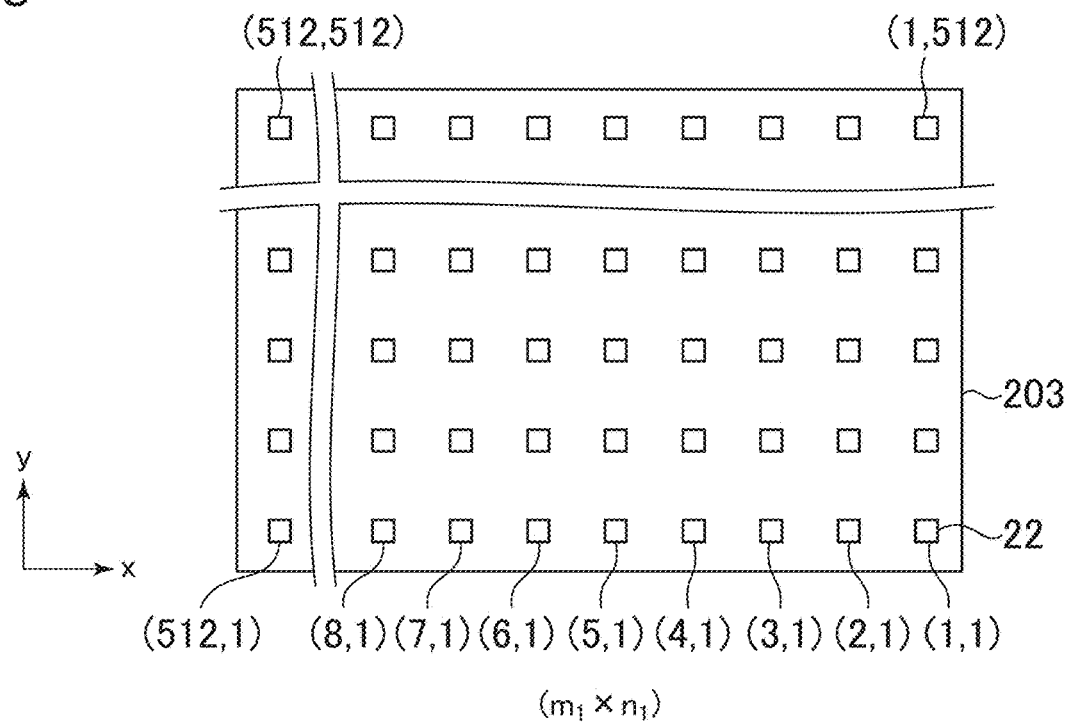
FIG. 2 is a conceptual diagram illustrating a configuration of a shaping aperture array member according to the first embodiment.

FIG. 2 is a conceptual diagram illustrating a configuration of the shaping aperture array substrate 203 in the present embodiment. In FIG. 2, in the shaping aperture array substrate 203, a two-dimensional shape of horizontal (x direction) $m_1$ columns×vertical (y direction) $n_1$ stages ($m_1$ and $n_1$ are integers of 2 or more) of holes (openings) 22 are formed in the x and y directions at a predetermined arrangement pitch. In the example of FIG. 2, a case is illustrated where 512×512 holes (openings) 22 are formed. Each hole 22 is formed of a rectangle having the same size and shape. Alternatively, each hole may be formed of a circle having the same outer diameter. By allowing a portion of the electron beam 200 to pass through the plurality of holes 22, the multiple primary electron beams 20 are formed. Herein, the example in which two or more columns of holes 22 are disposed in both the horizontal and vertical directions (x, y directions) is illustrated, but embodiments are not limited thereto. For example, there may be a plurality of columns in one of the horizontal and vertical directions (x, y directions), and there may be only one column in the other direction. In addition, as illustrated in FIG. 2, the method of arrangement of the holes 22 is not limited to a case where the holes are disposed in a lattice in the horizontal and vertical directions. For example, the holes in the k-th column in the vertical direction (y direction) and the holes in the (k+1)-th column may be disposed so as to be shifted by the dimension "a" in the horizontal direction (x direction). Similarly, the holes in the (k+1)-th column in the vertical direction (y direction) and the holes in the (k+2)-th column may be disposed so as to be shifted by the dimension "b" in the horizontal direction (x direction). Next, the operations of the electro-optical image acquisition mechanism 155 in the inspection apparatus 100 will be described.

An electron beam 200 emitted from an electron gun assembly (emission source) 201 is refracted by an electromagnetic lens 202, and the entire shaping aperture array substrate 203 is illuminated with the electron beam. As illustrated in FIG. 2, a plurality of holes (openings) 22 are formed in the shaping aperture array substrate 203, and a region including all the plurality of holes 22 is illuminated with the electron beam 200. By allowing each portion of the electron beam 200 irradiated to the position of the plurality of holes 22 to pass through the plurality of holes 22 of the shaping aperture array substrate 203, the multiple primary electron beams (multiple beams) 20 are formed.

The formed multiple primary electron beams 20 are refracted by the electromagnetic lens (reduction lens) 205 and the electromagnetic lens 206, respectively, and while repeating the intermediate image and performing the crossover, the multiple primary electron beams 20 pass through the beam separator 214 disposed at the positions of crossover each beam of the multiple primary electron beams 20 and propagate to the electromagnetic lens 207 (objective lens). Then, the electromagnetic lens 207 focuses the multiple primary electron beams 20 on the substrate 101. The multiple primary electron beams 20 focused on the substrate 101 (target object) surface by the electromagnetic lens 207 are collectively deflected by the main deflector 208 and the sub-deflector 209, and each irradiation position of the substrate 101 is irradiated with each beam. In addition, in a case where the entire multiple primary electron beams 20 are deflected collectively by the collective blanking deflector 212, the position deviates from the center hole of the limited aperture substrate 213 to be blocked by the limited aperture substrate 213. On the other hand, the multiple primary electron beams 20 not deflected by the collective blanking deflector 212 passes through the center hole of the limited aperture substrate 213 as illustrated in FIG. 1. By ON/OFF of the collective blanking deflector 212, blanking control is performed, and ON/OFF of the beam is collectively controlled. As a result, the limited aperture substrate 213 shields the multiple primary electron beams 20 deflected by the collective blanking deflector 212 so as to be in the beam OFF state. Then, the multiple primary electron beams 20 for inspection (for image acquisition) are formed by a group of beams formed having passed through the limited aperture substrate 213 after the beams are turned ON and before the beams are turned OFF.

When a desired position on the substrate 101 is irradiated with the multiple primary electron beams 20, a bundle of secondary electrons (multiple secondary electron beams 300) including reflected electrons corresponding to each beam of the multiple primary electron beams 20 from the substrate 101 due to the irradiation with the multiple primary electron beams 20 is emitted.

The multiple secondary electron beams 300 emitted from the substrate 101 pass through the electromagnetic lens 207 and propagate to the beam separator 214.

Herein, the beam separator 214 generates an electric field and a magnetic field in directions perpendicular to the plane perpendicular to the direction in which the center beam of the multiple primary electron beams 20 propagates (the center axis of the electron trajectory). The electric field exerts a force in the same direction regardless of the traveling direction of the electrons. On the other hand, the magnetic field exerts a force according to Fleming's left-hand rule. For this reason, the direction of the force acting on the electrons can be changed depending on the direction of intrusion of the electrons. With respect to the multiple primary electron beams 20 that intrude into the beam separator 214 from the upper side, the force due to the electric field and the force due to the magnetic field are canceled out by each other, and thus, the multiple primary electron beams 20 travel straight downward. On the other hand, with respect to the multiple secondary electron beams 300 that intrude into the beam separator 214 from the lower side, the force due to the electric field and the force due to the magnetic field act in the same direction, and thus, the multiple secondary electron beams 300 are bent obliquely upward to be separated from the multiple primary electron beams 20.

The multiple secondary electron beams 300 which are bent obliquely upward to be separated from the multiple primary electron beams 20 is further bent by the deflector 218 and projected on the multi-detector 222 while being refracted by the electromagnetic lenses 224 and 226. The multi-detector 222 detects the projected multiple secondary electron beams 300. The reflected electrons and secondary electrons may be projected onto the multi-detector 222, or the reflected electrons may diverge on the way, and thus, the remaining secondary electrons may be projected. The multi-detector 222 has, for example, a two-dimensional sensor (not illustrated). Then, each secondary electron of the multiple secondary electron beams 300 collides with the corresponding region of the two-dimensional sensor to generate an electron, and thus, secondary electron image data for each pixel is generated. The intensity signal detected by the multi-detector 222 is output to the detection circuit 106.

Figure 3:
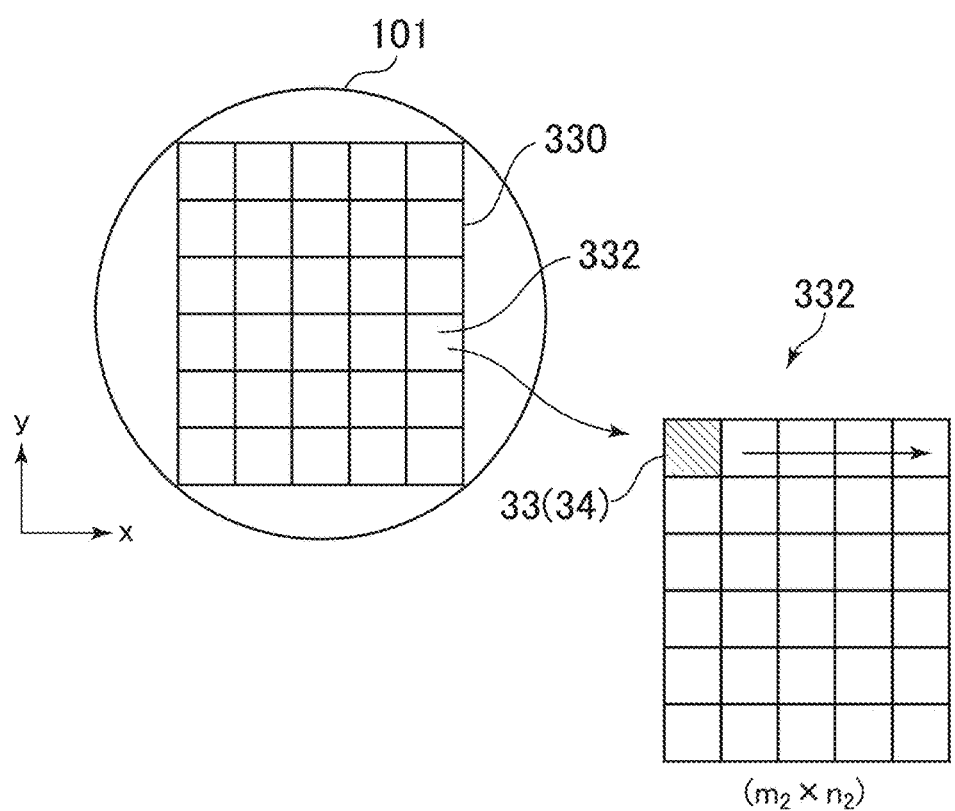
FIG. 3 is a diagram illustrating an example of a plurality of chip regions formed on a substrate according to the first embodiment.

FIG. 3 is a diagram illustrating an example of a plurality of chip regions formed on a substrate (wafer) 101 according to the present embodiment. In FIG. 3, a plurality of chips (wafer dies) 332 are formed in a two-dimensional array in an inspection region 330 of the substrate (wafer) 101. A mask pattern for one chip formed on a mask substrate for exposure is transferred onto each chip 332 with the mask pattern being reduced by, for example, ¼ by an exposing apparatus (stepper) (not illustrated). The inside of each chip 332 is divided into a plurality of mask dies 33 which are, for example, a two-dimensional shape of horizontal (x direction) $m_2$ columns×vertical (y direction) $n_2$ stages ($m_2$ and $n_2$ are integers of 2 or more) of mask dies. In the present embodiment, such a mask die 33 is a unit inspection region.

Figure 4:
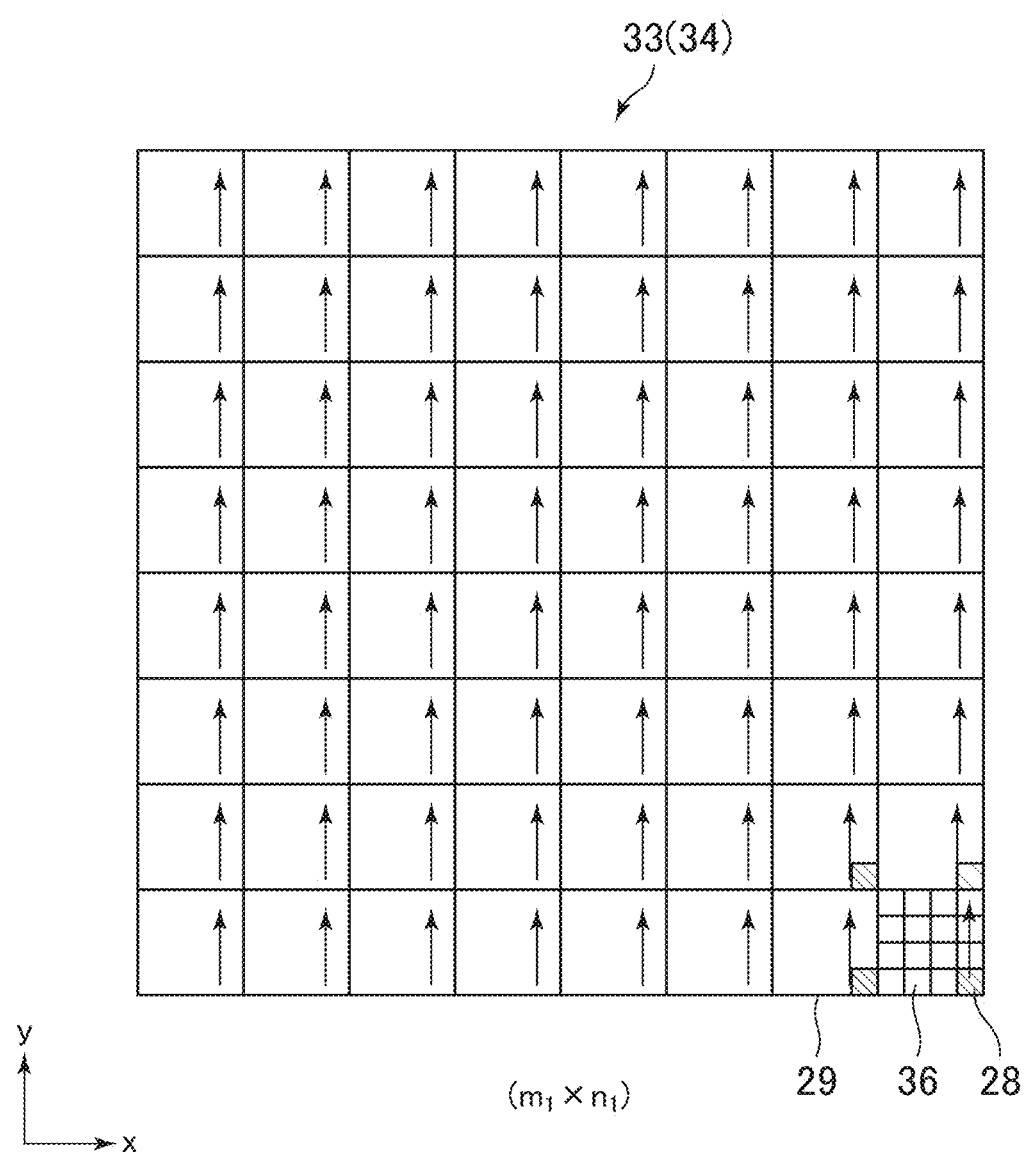
FIG. 4 is a diagram illustrating an example of an irradiation region of multiple beams and measurement pixels according to the first embodiment.

FIG. 4 is a diagram illustrating an example of an irradiation region of multiple beams and measurement pixels according to the present embodiment. In FIG. 4, each mask die 33 is divided into a plurality of mesh regions in a mesh shape, for example, with a beam diameter of each of multiple beams. Each of these mesh regions becomes a measurement pixel 36 (unit irradiation region). The example of FIG. 4 illustrates the case of 8×8 columns of multiple beams. The irradiation region 34 that can be irradiated by one irradiation of the multiple primary electron beams 20 is defined to have an area of (the size in the x direction obtained by multiplying the pitch between beams of the multiple primary electron beams 20 in the x direction by the number of beams in the x direction)×(the size in the y direction obtained by multiplying the pitch between beams of the multiple primary electron beams 20 in the y direction by the number of beams in the y direction). FIG. 4 illustrates a case where the irradiation region 34 has the same size as the mask die 33. However, these sizes are not limited thereto. The irradiation region 34 may be smaller than the mask die 33. Alternatively, the irradiation region 34 may be larger. Then, a plurality of measurement pixels 28 (beam irradiation positions at the time of one shot) that can be irradiated by one irradiation of the multiple primary electron beams 20 are illustrated in the irradiation region 34. In other words, the pitch between the adjacent measurement pixels 28 becomes the pitch between the multiple beams. In the example of FIG. 4, one sub-irradiation region 29 is formed by a square region surrounded by four adjacent measurement pixels 28 and including one measurement pixel 28 among the four measurement pixels 28. In the example of FIG. 4, a case where each sub-irradiation region 29 is configured with 4×4 pixels 36 is illustrated.

In the scan operation in the present embodiment, scanning is performed for each mask die 33. In the example of FIG. 4, an example in which one certain mask die 33 is scanned is illustrated. In a case where all the multiple primary electron beams 20 are used, in one irradiation region 34, $m_1 \times n_1$ sub-irradiation regions 29 are arranged in the x and y directions (two-dimensionally). The XY stage 105 is moved to be stopped at a position where the first mask die 33 can be irradiated with the multiple primary electron beams 20. At this position, the entire multiple primary electron beams 20 are collectively deflected to the reference position of the mask die 33 scanned with the multiple primary electron beams 20 by the main deflector 208, and the inside of the mask die 33 is scanned by setting the mask die 33 as the irradiation region (scanning operation). In a case where the scanning is performed while the XY stage 105 is continuously moved, tracking deflection is performed by the main deflector 208 so as to further follow the movement of the XY stage 105. Each beam constituting the multiple primary electron beams 20 are assigned for one of the different sub-irradiation regions 29. Then, at the time of each shot, one measurement pixel 28 corresponding to the same position within the assigned sub-irradiation region 29 is irradiated with each beam. In the example of FIG. 4, each beam is deflected by the sub-deflector 209 so as to irradiate the first measurement pixel 36 from the right of the lowest stage in the assigned sub-irradiation region 29 with the first shot. Then, irradiation of the first shot is performed. Subsequently, the beam deflection positions of the entire multiple primary electron beams 20 are collectively shifted in the y direction by one measurement pixel 36 by the sub-deflector 209, and the first measurement pixel 36 from the right of the second stage from the bottom in the assigned sub-irradiation region 29 is irradiated with the second shot. Similarly, the first measurement pixel 36 from the right of the third stage from the bottom in the assigned sub-irradiation region 29 is irradiated with the third shot. The first measurement pixel 36 from the right of the fourth stage from the bottom in the assigned sub-irradiation region 29 is irradiated with the fourth shot. Next, the beam deflection positions of the entire multiple primary electron beams 20 are collectively shifted to the position of the second measurement pixel 36 from the right of the lowest stage by the sub-deflector 209, and similarly, the measurement pixels 36 are sequentially irradiated in the y direction. By repeating the operation, all the measurement pixels 36 in one sub-irradiation region 29 are sequentially irradiated with one beam. In one shot, by the multiple beams formed by passing through each hole 22 of the shaping aperture array substrate 203, the multiple secondary electron beams 300 corresponding to a plurality of shots of which number is maximally the same as the number of holes 22 are detected at a time.

As described above, the mask die 33 as the irradiation region 34 is scanned by the entire multiple primary electron beams 20, but the corresponding one sub-irradiation region 29 is scanned by each beam. Then, when the scanning of one mask die 33 is completed, the next adjacent mask die 33 moves so as to be the irradiation region 34, and the next adjacent mask die 33 is scanned. This operation is repeated, and the scanning of each chip 332 is advanced. Each time when the shot of the multiple primary electron beams 20 is performed, the multiple secondary electron beams 300 are emitted from the irradiated measurement pixel 36 and detected by the multi-detector 222. In the present embodiment, the unit detection region size of the multi-detector 222 detects the multiple secondary electron beams 300 emitted upward from each measurement pixel 36 for each measurement pixel 36 (or each sub-irradiation region 29).

By performing scanning using the multiple primary electron beams 20 as described above, a scanning operation (measurement) can be performed at a higher speed than in the case of scanning using a single beam. In addition, the scanning of each mask die 33 may be performed by a step-and-repeat operation, or the scanning of each mask die 33 may be performed while the XY stage 105 is continuously moved. In a case where the irradiation region 34 is smaller than the mask die 33, the scanning operation may be performed while moving the irradiation region 34 in the mask die 33.

As described above, the electro-optical image acquisition mechanism 155 scans the substrate (wafer) 101 on which the pattern is formed by using the multiple primary electron beams 20 and detects the multiple secondary electron beams 300 emitted from the substrate (wafer) 101 due to the irradiation of the multiple primary electron beams 20. Secondary electron detection data (secondary electron image) from the measurement pixels 36 detected by the multi-detector 222 are output to the detection circuit 106 in the order of measurement. In the detection circuit 106, analog detection data are converted into digital data by an A/D converter (not illustrated) and stored in the stripe pattern memory 123. Then, for example, at a stage where the detection data for one chip 332 is accumulated, the chip pattern data together with the information indicating each position from the position circuit 107 are transmitted to the comparison circuit 141.

Figure 5:
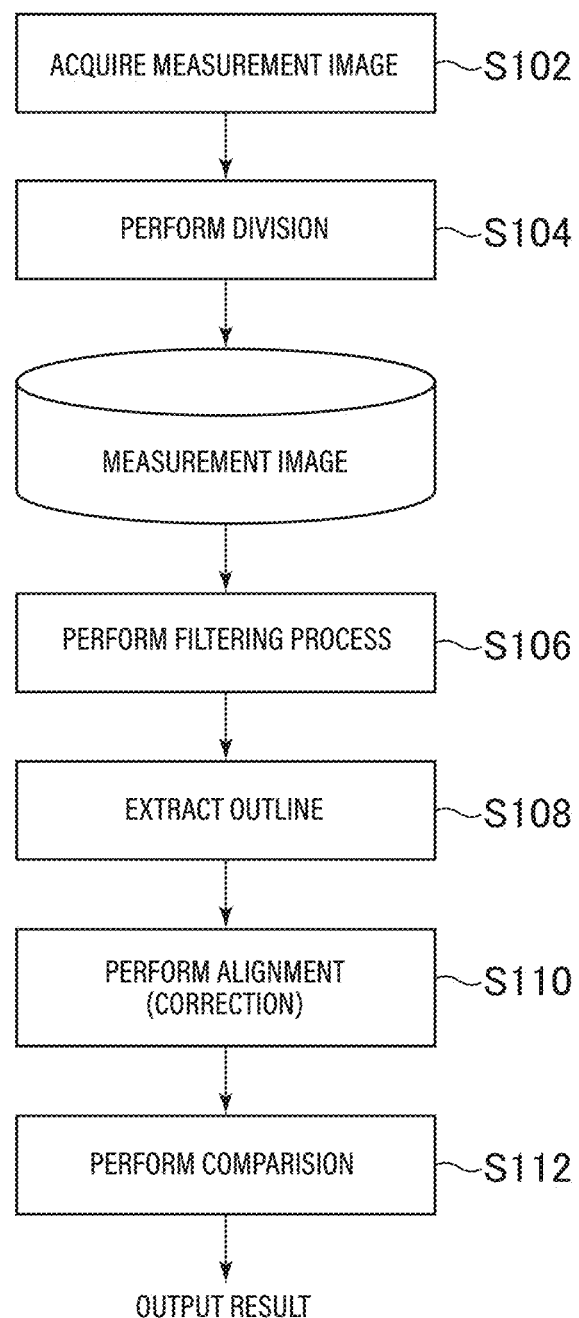
FIG. 5 is a flowchart of an inspection method according to the first embodiment.

FIG. 5 is a flowchart of the inspection method according to the present embodiment.

First, the electro-optical image acquisition mechanism 155 allows the first pattern formed on the substrate (wafer) 101 by using the electron gun assembly (irradiation source) 201 to be irradiated with the electron beams (multiple primary electron beams 20) to acquire a measurement image, which is a secondary electron image of the first pattern (S102 in FIG. 5).

Next, the control computer 110 cuts the first inspection image to be inspected from the above-described measurement image with the size of the mask die 33 which is the unit inspection region by using the division circuit 143 (S104 in FIG. 5). The first inspection image is stored in, for example, an image storage unit 132. In addition, the method of cutting is not limited to the method described above. Furthermore, the above-described measurement image may be used as the first inspection image. That is, the measurement image may be understood as an example of the first inspection image.

FIGS. 6A to 6C are schematic diagrams of the second pattern of the photomask of the present embodiment, the first pattern transferred onto the substrate (wafer) 101, and the first inspection image. FIG. 6A is a schematic diagram of the second pattern of the photomask. The second pattern is a line-and-space pattern of which length in the x direction is L. FIG. 6B is a schematic diagram of the first pattern formed by transferring the second pattern of the photomask illustrated in FIG. 6A onto the substrate (wafer) 101. The exposing apparatus (stepper) forms the first pattern, which is a line-and-space pattern, having, for example, a length in the x direction reduced to about L/4 on the substrate (wafer) 101. The outline of the first pattern may have undulations called roughness due to the resolution of the exposing apparatus, the influence of the size of the molecules of the resist and the developer, the presence of mask defects, and the like. In many cases, the minimum period of the roughness is approximately equal to the resolution of the exposing apparatus. FIG. 6C is a schematic diagram of the first inspection image, which is a secondary electron image of the first pattern illustrated in FIG. 6B. The first inspection image is, of course, an image of a line-and-space pattern. The outline included in the first inspection image is the first outline. The first outline extends perpendicular to the x direction and parallel to the y direction, as illustrated in FIG. 6C. The first outline reflects the shape of the roughness attached to the outline of the first pattern. However, much noise due to shot noise or the like caused by a small number of electrons per pixel of the image is included in the pixels near the first outline. For this reason, it is usually not easy to accurately extract the shape of the first outline unless a filtering process described later is performed. In addition, the second pattern and the first pattern are, of course, not limited to line-and-space patterns.

Next, the control computer 110 uses the filter circuit 139 to perform smoothing the first inspection image by using a local region (convolutional kernel) having a distribution with a width of the first size in a direction (y direction in FIG. 6C) parallel to the first outline and with a width of a second size smaller than the first size in a direction (x direction in FIG. 6C) perpendicular to the first outline. (S106 in FIG. 5). As a result, the second inspection image including the second outline generated by the smoothing is obtained from the first inspection image. The acquired second inspection image is stored in, for example, the image storage unit 132. As described above, by applying filters having different strengths in the direction parallel to the outline and the direction perpendicular to the outline along the direction of the outline, it is possible to maximally smooth noise without deteriorating the rise of the pixel value and the sharpness of each pixel of the first inspection image in the vicinity of the first outline.

Figure 7A:
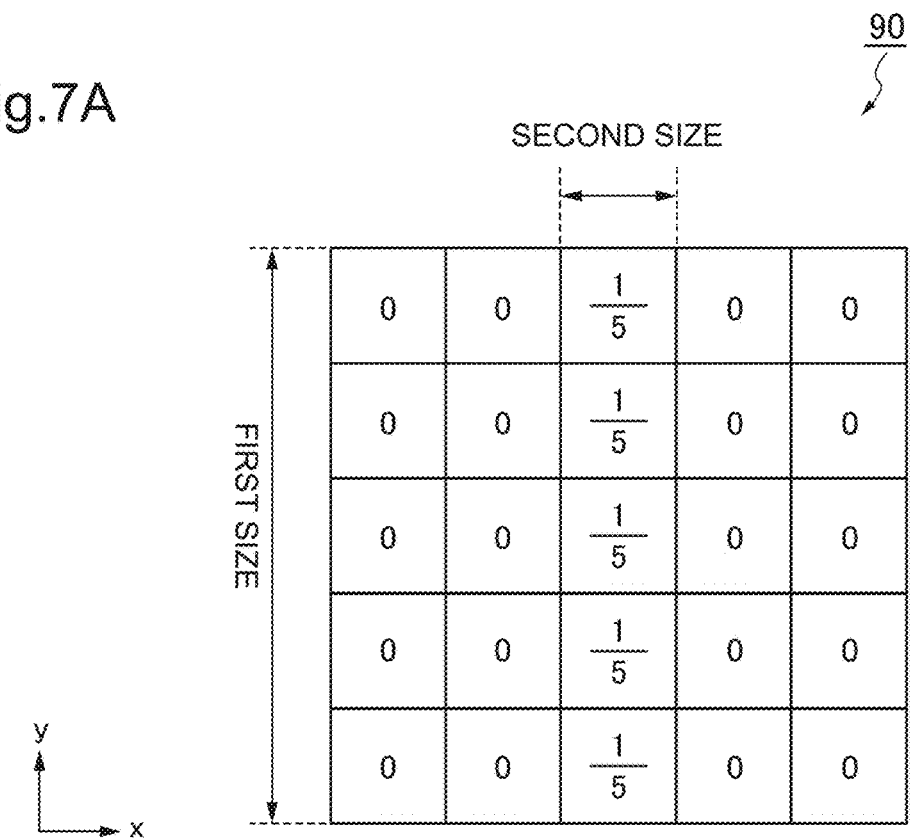
FIGS. 7A and 7B are an example of a shape of a local region and an example of a value of a weight used in a smoothing process according to the first embodiment.
Figure 7B:
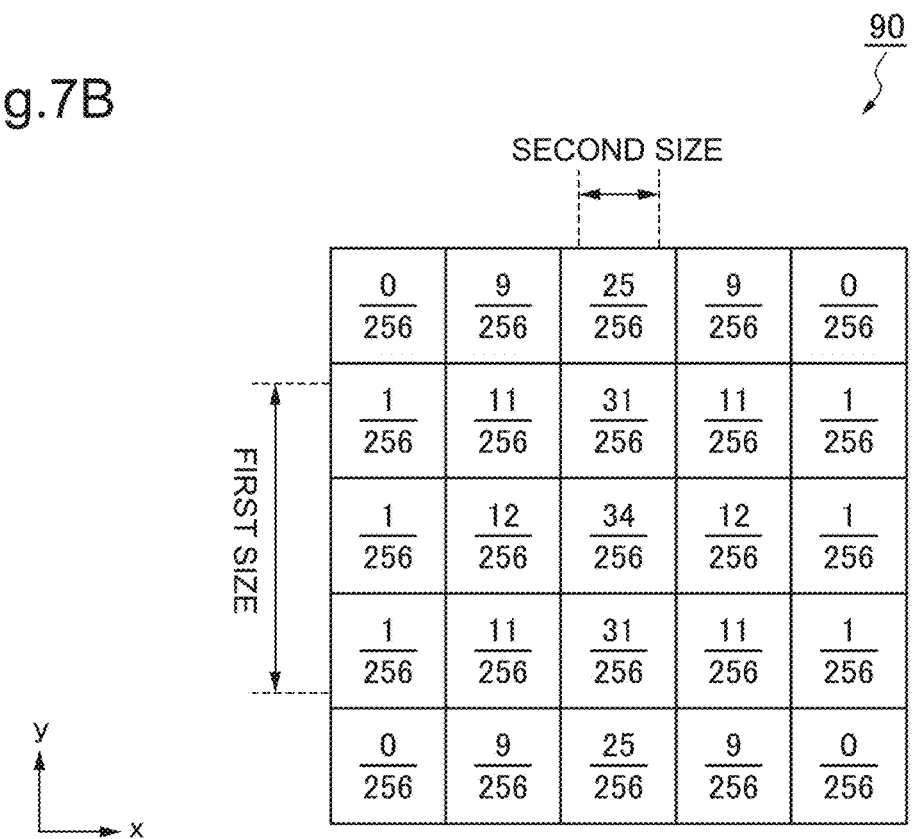

FIGS. 7A and 7B illustrate an example of the shape of the local region 90 and an example of the value of the weight used in the smoothing process. In the example of FIGS. 6A to 6C, since a vertical line-and-space pattern is used and the direction of the outline is always parallel to the y direction, a filter having a fixed arrangement as illustrated in FIGS. 7A and 7B can be used. Herein, it is assumed that the x direction in FIGS. 6A to 6C and the x direction in FIGS. 7A and 7B coincide with each other, and the y direction in FIGS. 6A to 6C and the y direction in FIGS. 7A and 7B coincide with each other. In addition, it is assumed that one square corresponds to one pixel. FIGS. 7A and 7B illustrate 5×5=25 squares in total, five in the x direction and five in the y direction. In addition, the shape of the pixel is not limited to a square.

FIG. 7A illustrates an example of the shape of the local region 90 used in the averaging process and an example of the value of the weight. The local region 90 has a first size in the y direction and a second size in the x direction. Herein, the first size is a size of 5 pixels (for 5 squares), and the second size is a size of 1 pixel (for 1 square). That is, as the weight of each pixel, a value of ⅕ is given only to the central one column, and vertical smoothing is performed as a whole. FIG. 7B is an example of the shape of the local region 90 and an example of the value of the weight used in the weighted averaging process. The first size of the local region 90 parallel to the y direction is set to 2.7 pixels, and the second size of the local region 90 parallel to the x direction is set to 0.7 pixels. Therefore, a Gaussian distribution having such a standard deviation is given. The value of the weight of each pixel is the largest value of 34/256 at the center of the local region 90 and is smaller than that around the center. In addition, as illustrated in FIG. 7B, the first size and the second size of the local region 90 may not be integral multiples of one side of the pixel. In addition, the local region 90 in the present embodiment may include a pixel having a weight value of 0 (zero) or a portion of the pixel having a weight value of (zero).

For an arbitrary pattern that is not limited to the line-and-space pattern, the directions of the edges are different depending on the locations in the image. In such a case, the joint bilateral filter using a predetermined guide image can be used for the above-described smoothing by the filter circuit 139. The filtering process (smoothing process) by the joint bilateral filter is a filtering process (smoothing process) represented by the following mathematical formula.

$$q(x_i) = \sum_j p(x_j) \frac{1}{K_i} G_{\sigma_s}(|x_i - x_j|) G_{\sigma_r}(|I(x_i) - I(x_j)|)$$

[Mathematical Formula 1]

Herein, when p is an input image (first inspection image), I is a predetermined guide image, q is an output image (second inspection image), $G_\sigma(x)$ is a Gaussian function, $K_i$ is a normalization coefficient so that q(xi) should be constant for a constant p(xj). Each of i and j indicates one pixel on the image, and $x_i$ and $x_j$ are coordinate vectors on the image corresponding to i and j on the image. In the joint bilateral filter, a filter kernel is configured by using a predetermined guide image I. Then, in a case where the position is close (for example, $|x_i-x_j|$ is small) and the pixel value in the predetermined guide image I is close (in other words, $|I(x_i)-I(x_j)|$ is small), the weight of the kernel of the filter increases. Therefore, a weak smoothing is performed in the direction of the gradient of the contour of the predetermined guide image I. On the other hand, a strong smoothing is performed in the direction perpendicular to the gradient of the contour of the predetermined guide image I.

In addition, the filtering process (smoothing process) by the joint bilateral filter can be described by the following mathematical formula in more specific form.

$$q(i,j) = \frac{\sum_{l,m} p(i-l, j-m) \frac{1}{2\pi\sigma_s^2} e^{-\frac{l^2+m^2}{2\sigma_s^2}} \frac{1}{2\pi\sigma_r^2} e^{-\frac{[I(i-l,j-m)-I(i,j)]^2}{2\sigma_r^2}}}{\sum_{l,m} \frac{1}{2\pi\sigma_s^2} e^{-\frac{l^2+m^2}{2\sigma_s^2}} \frac{1}{2\pi\sigma_r^2} e^{-\frac{[I(i-l,j-m)-I(i,j)]^2}{2\sigma_r^2}}}$$

[Mathematical Formula 2]

Herein, i and j represent the horizontal and vertical coordinate position on the image, p (i, j) represents the pixel value of the input image at the pixel position (i, j), I (i, j) represents the pixel value of the guide image, and $\sigma_s$ and $\sigma_r$ represent pixel units.

For the above-described smoothing by the filter circuit 139, a bilateral filter represented by the following mathematical formula without using a predetermined guide image I is known and often used.

$$q(x_i) = \sum_j p(x_j) \frac{1}{K_i} G_{\sigma_s}(|x_i - x_j|) G_{\sigma_r}(|p(x_i) - p(x_j)|)$$

[Mathematical Formula 3]

The bilateral filter corresponds to a filter using the input image $p(x_i)$ itself as the guide image $I(x_i)$ of the joint bilateral filter. For this reason, in a case where the position is close (for example, $|x_j-x_j|$ is small) and the pixel value in the input image p is close (for example, $|I(x_i)-I(x_j)|$ is small), the weight of the kernel of the filter increases. However, it is known that the bilateral filter may excessively emphasize the waveform of the edge so as to distort the waveform. As a result, there is a concern in that the shape of the outline is distorted.

One of the advantages of the joint bilateral filter is that an arbitrary image can be used as the predetermined guide image I. For this reason, more highly controlled filtering can be performed.

Any image can be used as a predetermined guide image I for the joint bilateral filter. However, for example, an image obtained by performing a predetermined filtering process on a design pattern generated from design data of a pattern (an example of a second pattern) can be used as the predetermined guide image I. In addition, for example, an image obtained by performing a predetermined filtering process on an inspection image (an example of a first inspection image) generated from an arbitrary pattern by irradiation with an electron beam can be used as the predetermined guide image I. Herein, as the predetermined filtering process, for example, a process by a Gaussian filter represented by the following mathematical formula is preferably used because simple and good results are obtained. In addition, the guide image generation circuit 142 is used to generate the guide image I. In addition, the predetermined filtering process is not particularly limited thereto.

$$I(x_i) = \sum_j p(x_j) \frac{1}{K_i} G_{\sigma_g}(|x_i - x_j|)$$

[Mathematical Formula 4]

By adjusting $\sigma_s$ and $\sigma_r$ in the above mathematical formula, smoothing processes having different intensities in the direction parallel to the first outline of the first inspection image and in the direction perpendicular to the first outline of the first inspection image can be performed.

The joint bilateral filter has two parameters $\sigma_s$ and $\sigma_r$, and the Gaussian filter for generating the guide image has one parameter $\sigma_g$. For this reason, in the filtering process (smoothing process) of the present embodiment, a total of three parameters can be specified. By appropriately adjusting these three parameters, the first size and the second size can be adjusted to desired values.

Specifically, it is considered to select, for example, three parameters so as to satisfy the following formulas when the first size is denoted by $D_{//}$, the second size is denoted by $D_\perp$, the pixel size is denoted by p, and the pixel value difference at the edge portion of the image is denoted by PV.

$$\sigma_s = D_{//}/(2.35 \times p)$$

[Mathematical Formula 5]

$$\sigma_r = D_\perp/(2.5 \times \sigma_g \times 2.35 \times p) \times PV$$

[Mathematical Formula 6]

The parameter $\sigma_g$ for generation of the guide image can be arbitrarily selected. However, the smoothing with the joint bilateral filter is performed so that the first size is smoothed in a direction along the contour of the guide image I, and the second size is smoothed in a direction perpendicular to the contour. Therefore, when the guide image generated by applying a Gaussian filter to the design pattern is used, the smoothing is applied in a direction along the outline of the design pattern. This facilitates smoothing in the correct direction. In addition, when the guide image generated by applying the Gaussian filter to the first inspection image is used, the smoothing is applied in a direction along the outline of the first inspection image. Therefore, particularly when the value of $\sigma_g$ is set to be relatively small, it is possible to perform the smoothing in the direction along the shape of the defects without crushing small defects included in the first inspection image. It is not preferable that the value of $\sigma_g$ be too large. For example, it is not preferable that both edges of a line pattern be included in the smoothing range of the Gaussian filter $\sigma_g$. By using a guide image having an appropriate slope (differential coefficient) at the edge portion of the outline portion and further appropriately setting the value of $\sigma_r$, the smoothing with the desired intensity (second size) can be applied in the direction perpendicular to the outline.

Regarding the "first size" and the "second size", the "first size" is preferably substantially equal to the resolution of the exposing apparatus. In addition, more specifically, the "first size" expressed in full width at half maximum (FWHM) is preferably "equal to ⅓ times or more and 1 time or less of the quotient ($\lambda$/(NA)) of a wavelength ($\lambda$) and the numerical aperture (NA) of the exposing apparatus". The minimum period of the undulation of the outline caused by the roughness is about the resolution of the exposing apparatus. That is, the minimum period of the undulation of the outline caused by the roughness is substantially equal to the resolution of the exposing apparatus. Therefore, even if this degree of smoothing is applied, the actual fine defect shape on the wafer is not removed, and only the noise of the outline portion is smoothed, so that a clear outline pattern can be obtained. Considering the case of EUV exposure, in a case where the wavelength is 13.5 nm, the NA is 0.33, and the $k_1$ factor is 0.34, a line-and-space pattern having a half pitch of 13.9 nm can be exposed. When the inspection of the first size at which defects can be most detected on some target object images is performed, the best results of about 22 nm can be obtained. In many cases, it is considered that setting the first size in the range of about 13.6 nm to 40.9 nm provides the best results. On the other hand, the "second size" is preferably "substantially equal to the beam diameter of the electron beam". Alternatively, the "second size" is preferably "full width at half maximum of half times or more and twice or less of the beam diameter of the electron beam". When the smoothing is performed with a smoothing radius considerably larger than the beam diameter, the sharpness of the edge will be reduced, which leads to a reduction in S/N and an increase in detection position error at the time of performing the outline extracting process or the like at a later stage. With the smoothing radius on the order of the beam diameter, it is possible to effectively reduce noise without significantly impairing the sharpness of the edge. When the inspection of the second size at which defects can be best detected on some target object images is performed, the best results of about 12 nm can be obtained for the image acquired with a device of which beam diameter is estimated to be 12 nm. In many cases, it is considered that the best result can be obtained by setting the second size in the range of about 6 to 24 nm. In addition, when the guide image is generated by applying the Gaussian filter to the first inspection image, the best result can be obtained by setting the full width at half maximum to about 24 nm. In general, it is considered that the line width of the pattern to be inspected is preferred to be suppressed to the line width or less.

Figure 8A:
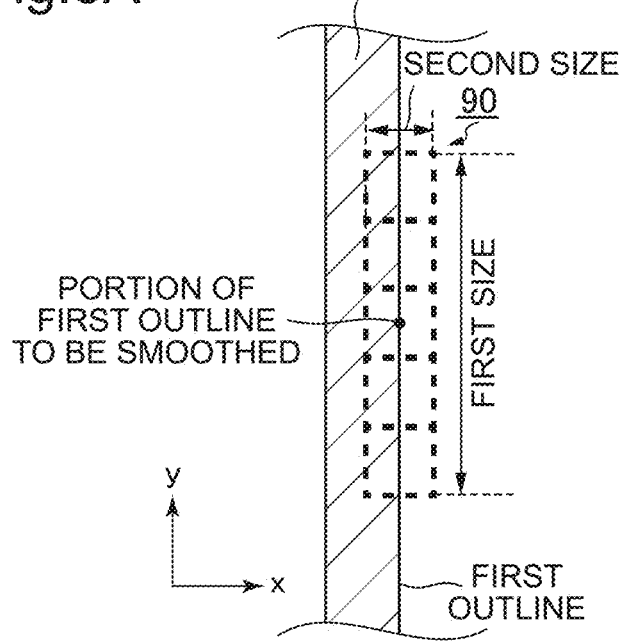
FIGS. 8A and 8B are examples of a first outline and a local region in the smoothing process according to the first embodiment.
Figure 8B:
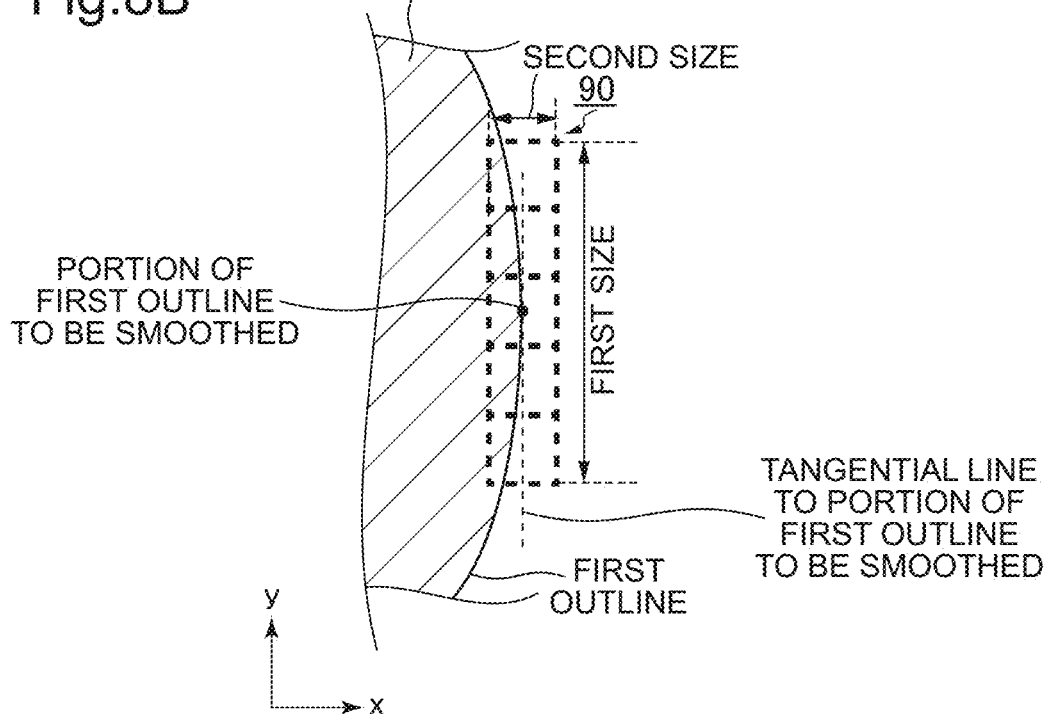

FIGS. 8A and 8B are examples of the first outline and the local region 90 in the smoothing process according to the present embodiment. FIG. 8A is the same as that illustrated in FIG. 6A for the first inspection image and the first outline and is the same as that illustrated in FIG. 7A for the local region 90. Then, the smoothing is performed by the local region 90 overlapping the portion of the first outline to be smoothed so that the first size is parallel to the first outline.

In FIG. 8B, the first inspection image has an arc-shaped first outline. In a case where the direction of the outline is not directed to a certain direction and includes a curve or a two-dimensional pattern, a fixed local region as illustrated in FIGS. 7A and 7B cannot be applied, and processing of Mathematical Formula 1 will be applied. Therefore, the direction of the "first size" matches with the direction of the outline included in the image, and the image is more strongly smoothed in this direction. Even in this case, in a case where the direction of the outline included in the image is the vertical direction, as a result, the same smoothing as in FIGS. 7A and 7B is performed.

Next, the control computer 110 extracts the second outline included in the second inspection image by using the outline extraction circuit 140 (S108 in FIG. 5).

Figure 9:
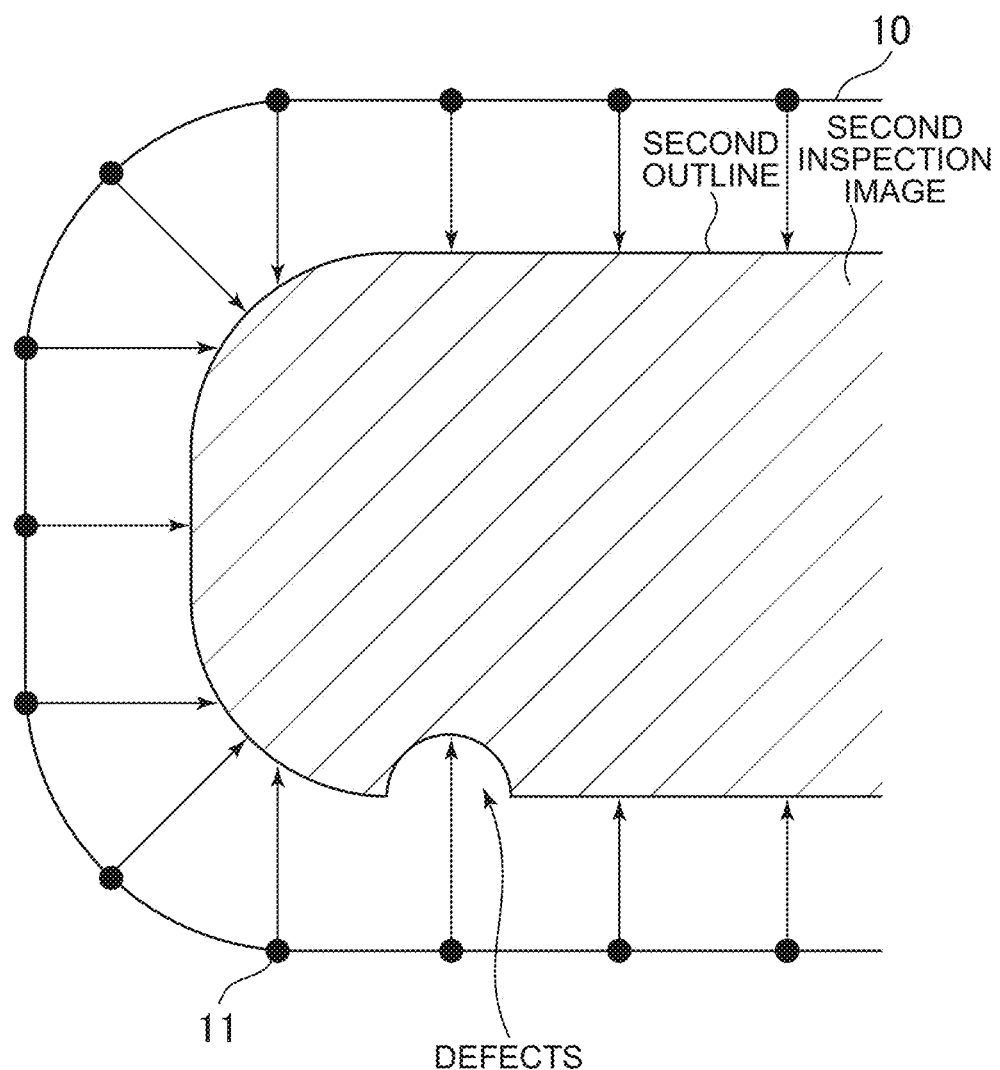
FIG. 9 is a diagram for describing an example of extraction of a second outline of a second inspection image according to the first embodiment.

FIG. 9 is a diagram for describing an example of extraction of the second outline of the second inspection image according to the present embodiment. The outline extraction circuit 140 reads the second inspection image to be inspected from the image storage unit 132. In addition, for example, from the image storage unit 132, the outline extraction circuit 140 reads, the reference outline data of the reference pattern corresponding to the pattern in the mask die image to be inspected or the reference outline data obtained from the reference image thus obtained by irradiation with an electron beam on the pattern in the mask die image to be inspected. These reference outline data may also be the data obtained by applying the smoothing process described in the present patent from the image to be referred to. The reference outline data is the shape or coordinate values of the outline extracted as specific data. Since the pattern in the second inspection image is defined as the pixel value data for each pixel 36, the outline extraction circuit 140 specifies the coordinates of the point 11 on the reference outline 10 of the reference pattern, for example, for each one pixel 36 as illustrated in FIG. 9. Then, as illustrated in FIG. 9, the outline extraction circuit 140 extracts the end (edge) of the pattern in the second inspection image from each of the coordinate positions of the plurality of points 11 on the reference outline 10 in the normal direction of the reference outline 10. The outline extraction circuit 140 extracts the second outline by connecting the above-mentioned ends (edges). In addition, there is no relationship between the second inspection image illustrated in FIGS. 8A and 8B and the first inspection image illustrated in FIGS. 6A to 6C.

Figure 10A:
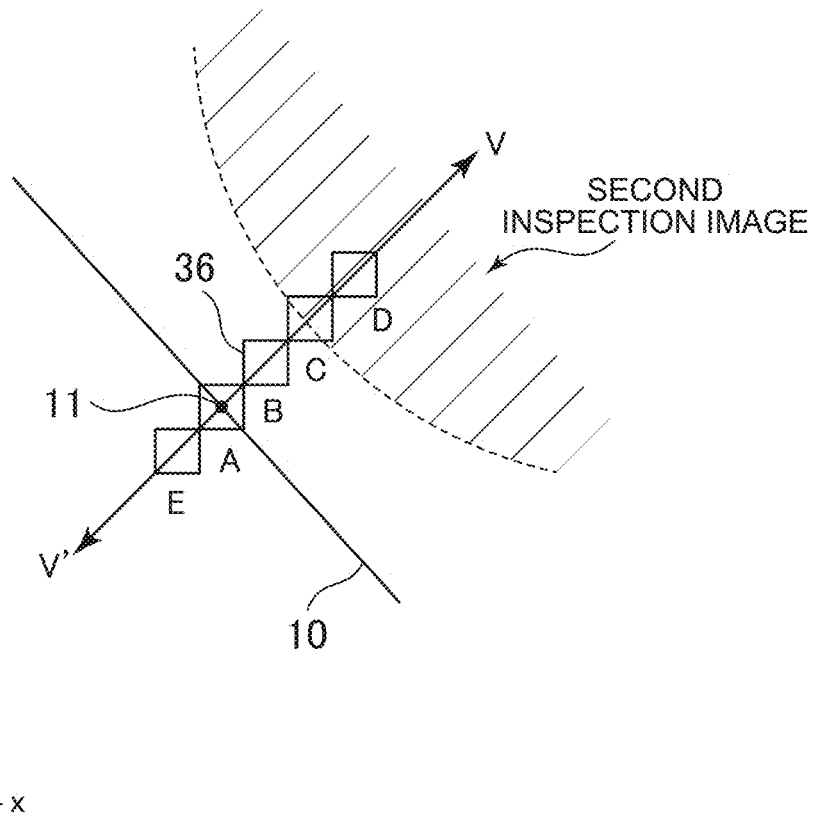
FIGS. 10A and 10B are diagrams for describing a method of extracting an end (edge) of a pattern within the second inspection image according to the first embodiment.
Figure 10B:
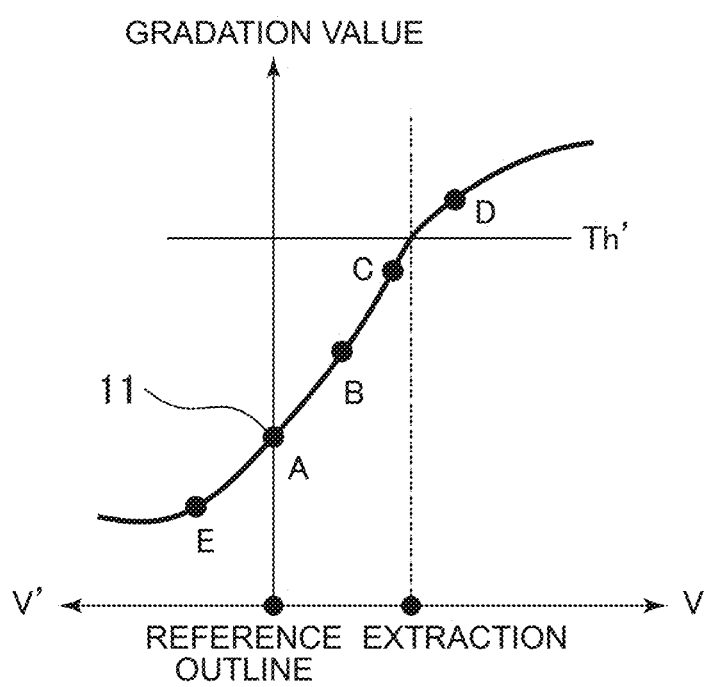

FIGS. 10A and 10B are diagrams for describing a method of extracting an end (edge) of the pattern in the second inspection image in the present embodiment. In the example of FIG. 10A, the vicinity of one point 11 on the reference outline 10 is illustrated so as to be enlarged. An edge of the pattern of the second inspection image is searched for, for example, by one pixel 36 from the same coordinates in the measurement image as the coordinates of the point 11 on the reference outline 10 in the normal direction of the reference outline 10. Even in a case where the design coordinates are applied to the measurement image, the position deviation between the reference outline 10 and the pattern can be suppressed to several pixel sizes (for example, about three pixels) or less. In the example of FIG. 10B, a relationship between the pixel value and the position in the search direction VV' (normal direction) is illustrated. The searching is started in the V direction and the V' direction (−V direction) from the pixel A on the coordinates of the point 11 on the reference outline 10. In a case where the distance between the reference outline 10 and the pattern is not large, as illustrated in FIG. 10B, the pixel value of the adjacent pixel B in the direction from the pixel A on the coordinates of the point 11 toward the pattern becomes close to the threshold value Th' for determining an edge. On the contrary, the pixel value of the adjacent pixel E going in the direction opposite to the pattern from the pixel A is separated from or is not changed from the threshold value Th' for determining the edge. The example of FIG. 10A illustrates a case where the reference outline 10 is located outside the pattern. For this reason, the pixel value of the adjacent pixel B becomes larger than the pixel value of the pixel A and approaches the threshold value Th'. Then, the pixel value of the adjacent pixel E becomes smaller than or equal to the pixel value of the pixel A. On the other hand, in a case where the reference outline 10 is located inside the target pattern 12, the pixel value of the adjacent pixel B becomes smaller than the pixel value of the pixel A and approaches the threshold value Th'. Then, the pixel value of the adjacent pixel E becomes larger than or equal to the pixel value of the pixel A. From the above description, it can be determined that the direction from the pixel A to the pattern is the pixel B side. Then, referring to the pixel values of the pixels B, C, and D in order from the pixel A in the normal direction (V direction) of the reference outline 10, for example, from one pixel 36, the searching is performed until the pixels D exceeding (or straddling) the threshold value Th'. As a result, it can be understood that the end (edge) of the pattern exists between the pixels C and D. By performing interpolation, such as linear interpolation, on the pixel values of the pixels C and D, for example, in units of sub-pixels, the position of the end (edge) of the pattern can be specified. The outline extraction circuit 140 similarly extracts the positions of the ends (edges) of the pattern for the plurality of points 11 on the reference outline 10. As a result, it is possible to acquire the second outline of the second inspection image.

In addition, the method of extracting the second outline is not limited to the above-described method.

Next, the control computer 110 performs alignment between the reference outline and the extracted outline of the target pattern 12 by using the alignment circuit 144 (S110 in FIG. 5). At this time, it is preferable to correct the reference outline by using a model such as the least square method.

Figure 11A:
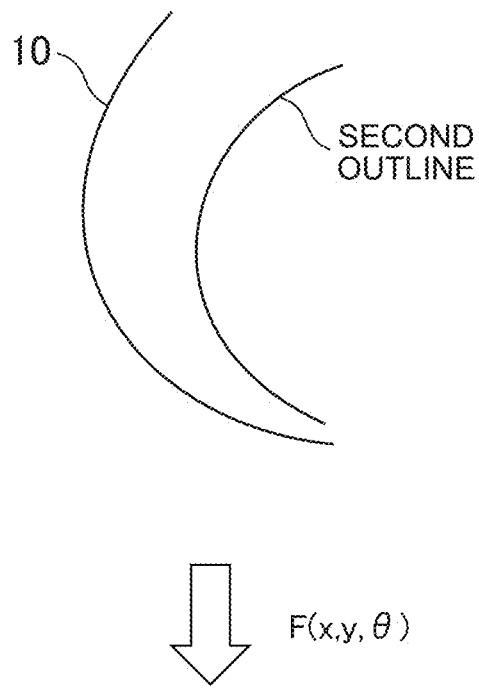
FIGS. 11A and 11B are diagrams illustrating an example of alignment correction according to the first embodiment.
Figure 11B:
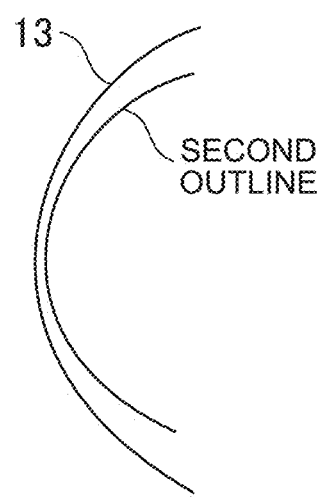

FIGS. 11A and 11B are diagrams illustrating an example of alignment correction according to the present embodiment. As the alignment, for example, a correction conversion that allows only the translation in the x and y directions and the rotation (θ) is considered. The evaluation function indicating the difference between the corrected reference outline and the extracted target pattern is represented by a distance between the outlines. By optimizing the distance by the least square method or the like, the parameters of the correction conversion, that is, the translation distance and the rotation angle are determined. When there are the reference outline 10 and the extracted second outline as illustrated in FIG. 11A, the translation and rotation conversion is used to correct the reference outline 10 as illustrated in FIG. 11B, and thus, to obtain the corrected outline 13 closer to the second outline. In addition, in the case of performing the correction, since the content of the correction herein is limited to translation and rotation, even after the correction, the reference outline does not match the outline of the target pattern including the defective portions, and the difference between the defective portions can be clearly detected.

Next, by using the comparison circuit 141, the control computer 110 compares the outline 13 corrected by aligning the reference outline 10 with the second outline. In addition, the control computer 110 may compare the reference outline 10 before the correction with the second outline (S112 in FIG. 5).

Alternatively, the control computer 110 compares a predetermined reference image having the corrected outline 13 with the second inspection image having the second outline by using the comparison circuit 141 (S112 in FIG. 5). In addition, the control computer 110 may compare an image having the reference outline 10 before performing the correction with the second inspection image as the predetermined reference image (S112 in FIG. 5). In addition, the control computer 110 may compare the predetermined reference image with the second inspection image without extracting the outline (S108 in FIG. 5).

Figure 12A:
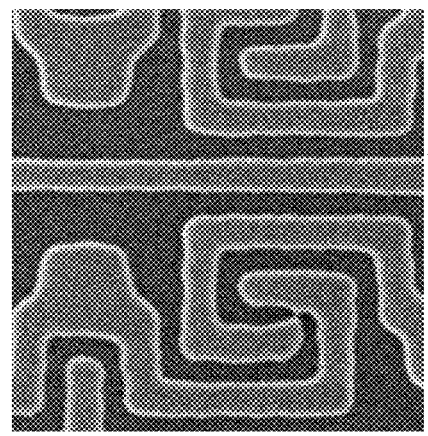
FIGS. 12A to 12E are diagrams illustrating the functions and effects of the first embodiment.
Figure 12B:
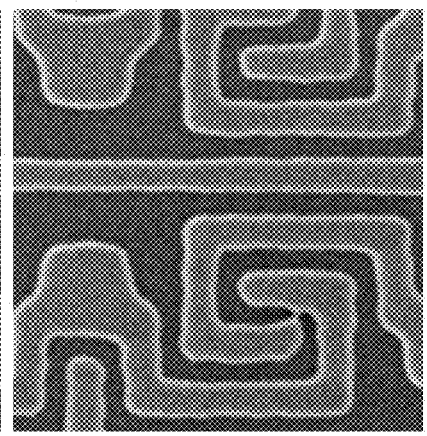
Figure 12C:
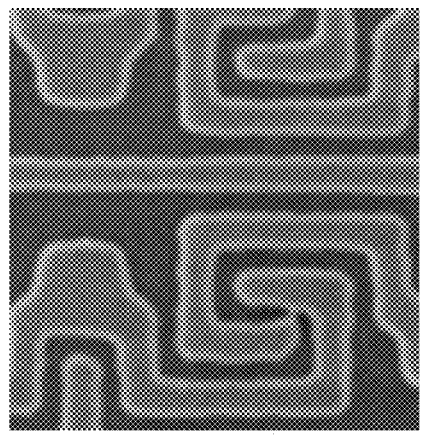
Figure 12D:
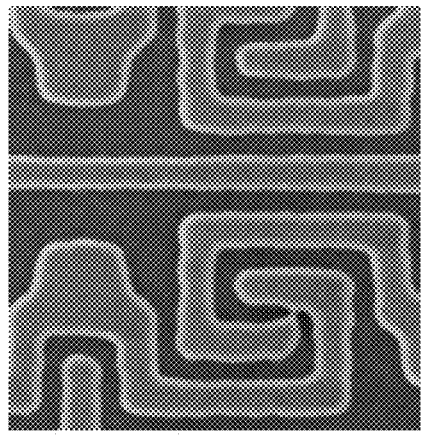
Figure 12E:
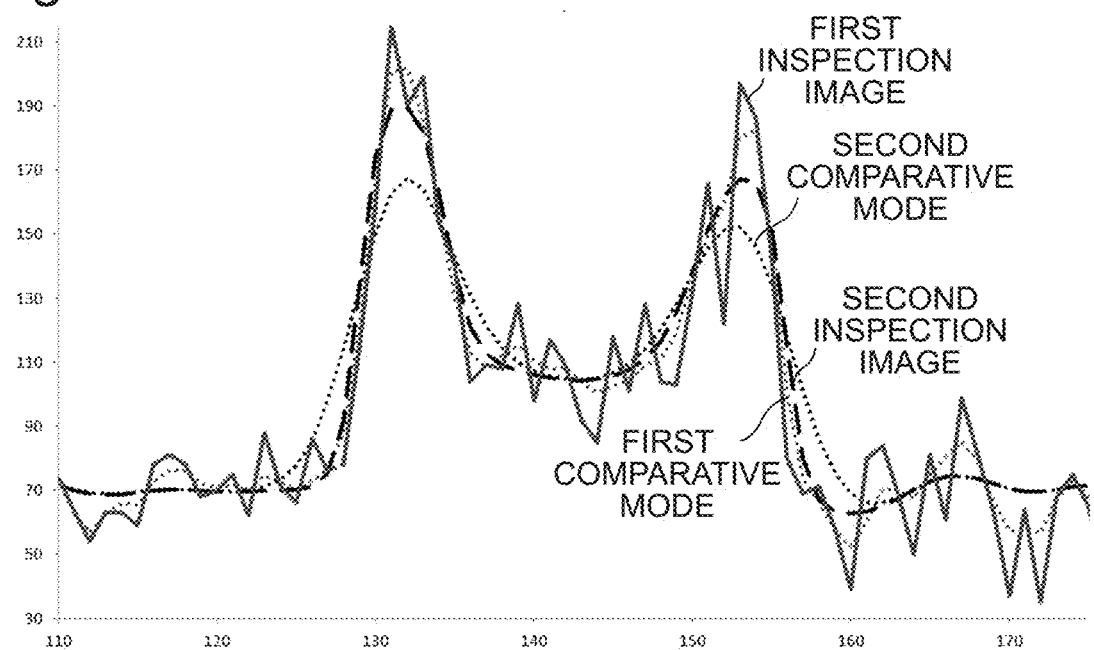

FIGS. 12A to 12E are diagrams illustrating the functions and effects of the present embodiment. FIG. 12A is an example of the first inspection image. FIG. 12B illustrates an image which is a first comparative mode obtained by performing a smoothing process using a Gaussian filter having a full width at half maximum of about 4 nm on the example of the first inspection image illustrated in FIG. 12A. FIG. 12C illustrates an image which is a second comparative mode obtained by performing a smoothing process using a Gaussian filter having a full width at half maximum of about 24 nm on the example of the first inspection image illustrated in FIG. 12A. FIG. 12D illustrates an example of a second inspection image obtained by performing a smoothing process using a joint bilateral filter having a full width at half maximum of 4 nm in a direction perpendicular to the first outline and a full width at half maximum of 24 nm in a direction parallel to the first outline with respect to the example of the first inspection image illustrated in FIG. 12A. FIG. 12E is a graph for comparing the images illustrated in FIGS. 12A to 12D. In addition, the horizontal axis represents coordinates on the image, and the vertical axis represents pixel values. In the case of the image obtained by using the joint bilateral filter illustrated in FIG. 12D, the degree of change in the pixel value in the portion where the noise is removed most and the pixel value is sharply changed is maintained the best.

Next, the functions and effects of the present embodiment will be described in detail.

In comparison with the pattern inspection using light, in the case of pattern inspection using an electron beam, because the number of electrons used is small, there is a problem in that noise is increased. For this reason, it has been difficult to perform good inspection while removing noise. Since the pattern inspection apparatus needs to find defects in the image by reading an image of the entire pattern, there is a very strong demand for a reduction in processing time. In the case of a general pattern image acquisition apparatus using an electron beam, noise is reduced by operating slowly to increase the number of electrons, or by imaging the same location many times and superimposing the images. However, in such a method, it takes more than one month to inspect one chip, which is completely unacceptable. Therefore, reducing the number of required electrons by reducing noise directly leads to a reduction in processing time, which is extremely important.

In the related art, noise is reduced by performing a smoothing process on the obtained image by using a Median filter or a Gaussian filter, and after that, the edge of the pattern is detected to extract the outline of the image. However, in the case of the Median filter, the noise reduction effect is limited when the number of pixels is as small as about 3×3. On the other hand, the Median filter having a large size has a problem that the processing efficiency is not high. Furthermore, the Median filter has a problem that the position of the edge of the pattern may not be maintained before and after the smoothing process.

In the case of a smoothing process using a Gaussian filter, generally, by setting the full width at half maximum to be slightly larger than the electron beam diameter, the edge detection accuracy is maximized. However, there is a problem in that the noise reduction effect is not sufficient. On the other hand, in the case of using a Gaussian filter having a larger full width at half maximum, the detected pattern itself is blurred, and thus, even though noise is reduced, there is a problem in that the edge detection accuracy is rather lowered.

In the inspection apparatus and the inspection method of the present embodiment, by using the joint bilateral filter, the smoothing is performed using the local region having a first size in a direction parallel to the first outline and a second size smaller than the first size in a direction perpendicular to the first outline of the first inspection image. By using the joint bilateral filter, it is possible to control the filter strength in a direction perpendicular to the outline of the pattern and in a direction parallel to the outline of the pattern. As a result, it is possible to sufficiently reduce noise without blurring the pattern the edge more than necessary, and it is possible to reduce the number of electrons required for inspection, so that it is possible to realize the required inspection time (inspection speed).

The inspection method and the inspection apparatus according to the present embodiment are particularly useful for inspecting the first pattern formed by transferring the second pattern of the photomask onto the wafer by using the exposing apparatus. The point spread function (PSF) of the exposing apparatus is much larger than the beam diameter of the electron beam. For example, the PSF in extreme ultraviolet lithography (EUV) exposure at a wavelength of 13.5 nm and a numerical aperture (NA) of 0.33 is about 20 nm, and the minimum line width is larger than 15 nm. Therefore, although any small defects exist in the second pattern of the photomask, the pattern is transferred onto the first pattern formed on the wafer by transferring in a form of being blurred by about 20 nm. In addition, in the first outline of the first inspection image generated from the first pattern, the influence of the photomask defect appears over at least about 20 nm.

On the other hand, the edge of the first pattern formed by transferring onto the wafer is formed by an etching process. For this reason, the edge of the first pattern can be formed at a relatively steep angle of about 80 degrees to 90 degrees with respect to the wafer surface. For this reason, the smoothing is performed by using the local region having the first size in the direction parallel to the first outline of the first inspection image. On the other hand, the smoothing is performed by using the local region having the second size smaller than the first size in the direction perpendicular to the first outline. This is because, in the direction parallel to the first outline, the smoothing process is performed as strongly as possible without any particular problem, and in the direction perpendicular to the first outline, the smoothing process is performed to the extent that the edge detection accuracy is maximized. As a result, it is possible to provide an inspection apparatus and an inspection method with improved pattern edge detection accuracy.

Second Embodiment

An inspection apparatus according to the present embodiment includes: an irradiation source that irradiates a first pattern formed by transferring a second pattern of a mold onto a water with an electron beam; a detection circuit acquires a first inspection image generated from the first pattern by irradiation; a filter circuit that performs smoothing using a local region having a first size in a direction parallel to a first outline included in the first inspection image and a second size smaller than the first size in a direction perpendicular to the first outline and acquires a second inspection image including a second outline generated by the smoothing; and a comparison circuit that compares the second inspection image with a predetermined reference image.

Then, the first pattern is transferred onto the wafer by a thermal nanoimprint method.

Herein, description of contents overlapping with the first embodiment will be omitted.

FIGS. 13A to 13E are schematic cross-sectional views illustrating a method of manufacturing the first pattern used in the present embodiment. In the thermoplastic thermal nanoimprint method described herein as an example, a pattern (third pattern) is formed, for example, by pressing a mold in which nano-sized unevenness (second pattern) is formed against a resin (thermoplastic resin) formed on the wafer to deform the resin. Next, the pattern (first pattern) is formed on the wafer by using the deformed resin as a protective film. After that, the resin is removed.

First, a substrate (wafer) 170, a resin 172 applied on the substrate 170, and a mold 174 are heated to raise these temperatures to a glass transition temperature Tg of the resin or higher. As the resin 172, for example, a thermoplastic resin such as polycarbonate (PC), polymethyl methacrylate (PMMA), or polyethylene terephthalate (PET) is preferably used. The mold 174 is formed by processing a silicon (Si) substrate by, for example, electron beam lithography.

Figure 13A:
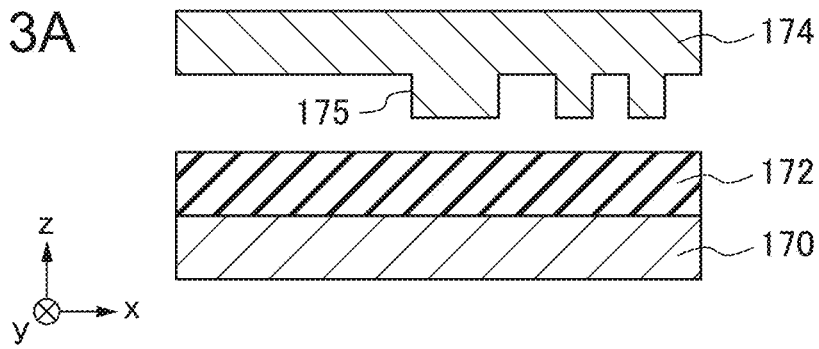
FIGS. 13A to 13E are schematic cross-sectional views illustrating a method of manufacturing a first pattern used in a second embodiment.
Figure 13B:
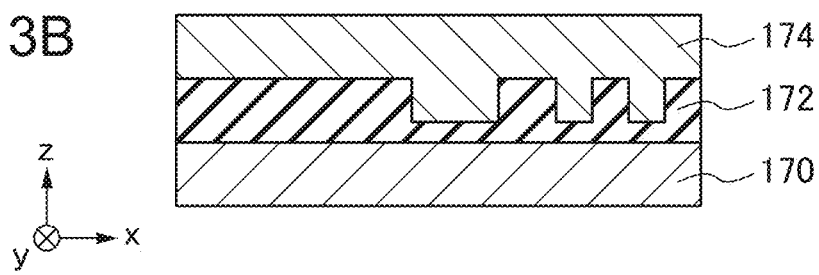

Next, the mold 174 is pressed against the resin 172 applied on the substrate 170 for a predetermined time (FIGS. 13A and 13B). Next, the substrate 170, the resin 172, and the mold 174 are cooled to the glass transition temperature Tg of the resin or lower.

Figure 13C:
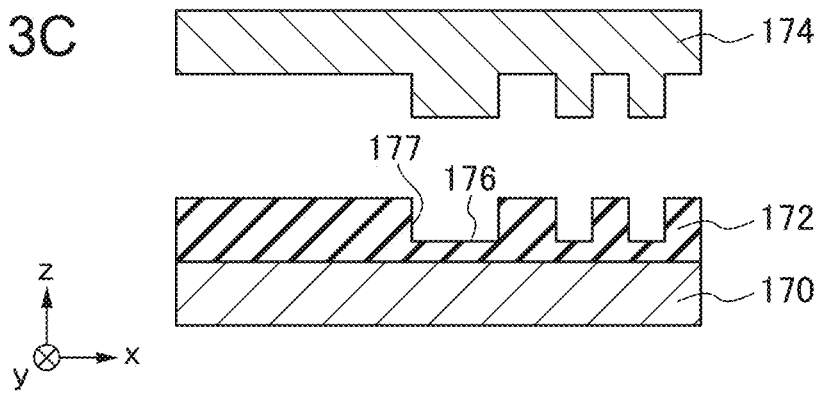
Figure 13D:
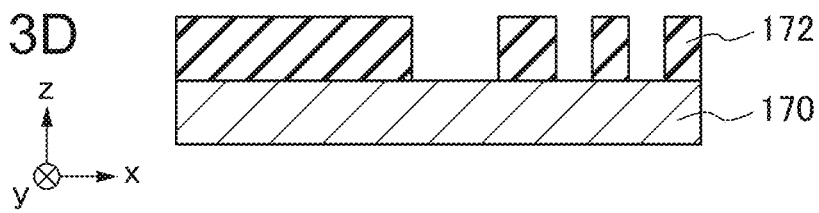

Next, the mold 174 is peeled off from the resin 172 (FIG. 13C). As a result, a third pattern 177 onto which a second pattern 175 of the mold 174 is transferred is formed on the resin 172.

Figure 13E:
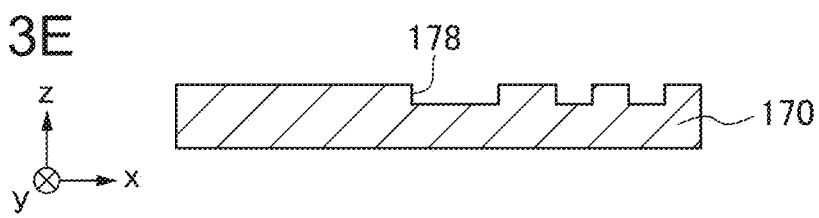

Next, by removing a remaining film 176 remaining in the concave portion of a third pattern 177 and a portion of the substrate 170 by etching (FIG. 13D), the substrate 170 onto which a first pattern 178 corresponding to the third pattern 177 is transferred is obtained (FIG. 13E). The first pattern 178 obtained herein is, for example, a line-and-space pattern extending in the y direction.

In addition, the first pattern may be formed by, for example, a thermosetting nanoimprint method using a thermosetting resin such as methacrylic or vinyl compounds as the resin 172.

The inspection apparatus and the inspection method according to the present embodiment can be preferably applied to the first pattern formed by using a thermal nanoimprint method.

Unlike in lithography using an exposurer, in nanoimprinting, it is not possible to determine the minimum period of roughness due to the resolution of the exposurer. However, it is possible arbitrarily determine the first size without any problem even if the smoothing is applied by roughness due to the process, the assumed defect size, or the like. In addition, with respect to the second size, similarly to the first embodiment, it is possible to select an appropriate value of about the beam diameter of the electron beam used for inspection.

Third Embodiment

In an inspection apparatus according to the present embodiment, a second pattern is transferred onto a wafer by an optical nanoimprint method. Herein, description of contents overlapping with the first embodiment and the second embodiment will be omitted.

FIGS. 14A to 14F are schematic cross-sectional views illustrating a method of manufacturing a first pattern used in the present embodiment. Herein, the optical nanoimprint method using ultraviolet (UV) is used.

Figure 14A:
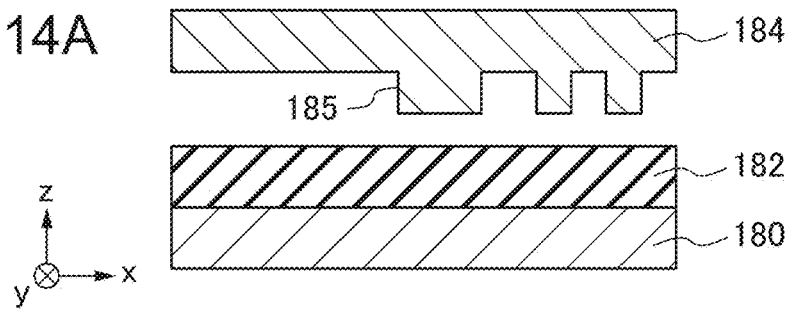
FIGS. 14A to 14F are schematic cross-sectional views illustrating a method of manufacturing a first pattern used in a third embodiment.
Figure 14B:
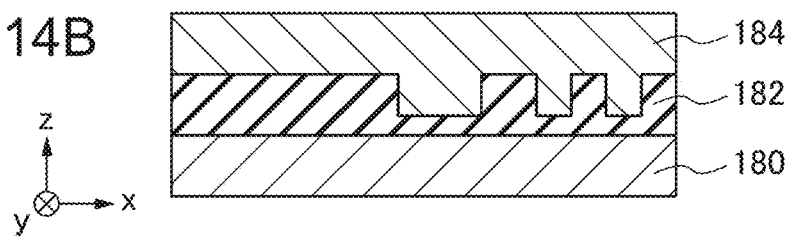

First, a mold 184 on which a second pattern 185 is formed is pressed against a resin 182 applied on a substrate (wafer) 180 (FIGS. 14A and 14B). The resin 182 is obtained, for example, by applying a liquid UV curable resin on the substrate 180 by a spin coating method or the like. The mold 184 is made of, for example, a quartz that is transparent to UV.

Figure 14C:
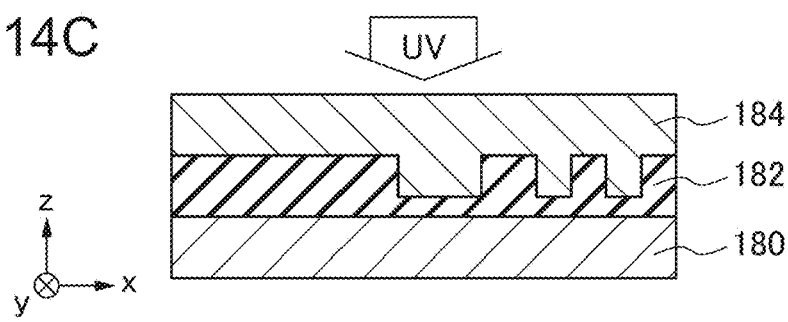
Figure 14D:
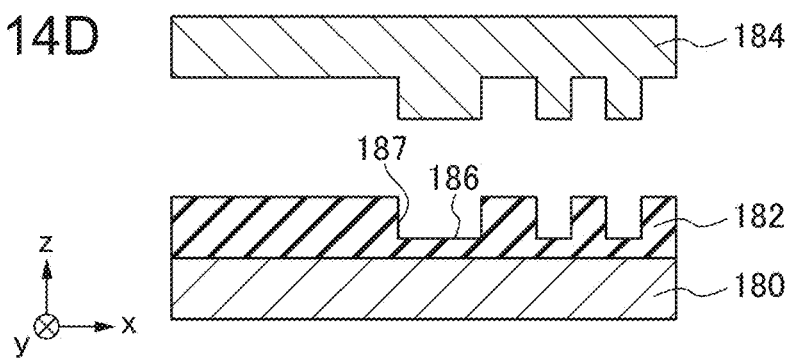
Figure 14E:
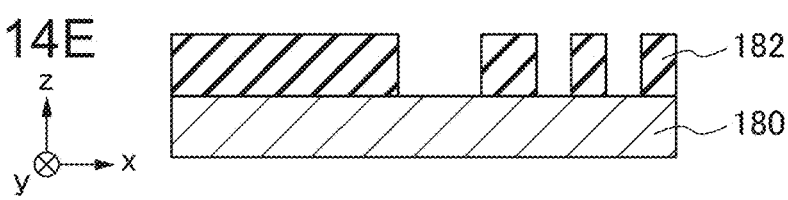

Next, while the mold 184 is pressed, the resin 182 is irradiated with, for example, UV through the mold 184 to cure the resin 182 (FIG. 14C). Next, the mold 184 is peeled off from the resin 182 (FIG. 14D). As a result, a third pattern 187 onto which a second pattern 185 of the mold 184 is transferred is formed on the resin 182.

Figure 14F:
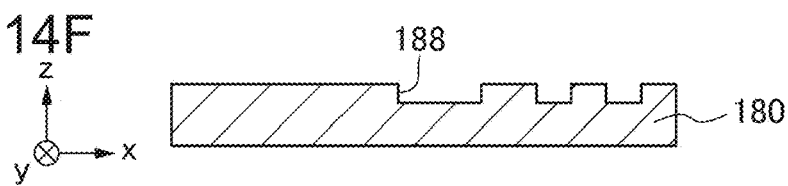

Next, by removing a remaining film 186 remaining in a concave portion of the third pattern 187 and a portion of the substrate 180 by etching (FIG. 14E), the substrate 180 onto which a first pattern 188 corresponding to the third pattern 187 is transferred is obtained (FIG. 14F). The first pattern 188 obtained herein is, for example, a line-and-space pattern extending in the y direction.

The inspection apparatus and the inspection method according to the present embodiment can be preferably applied to the first pattern formed by using the optical nanoimprint method.

In addition, in the present embodiment, similarly to the second embodiment, the first size and the second size can be appropriately determined, and only the noise is reduced by filtering without impairing the sharpness of the edge, so that a highly accurate outline can be extracted.

Fourth Embodiment

An inspection apparatus according to the present embodiment includes: an irradiation source that irradiates a first pattern formed by self-assembly lithography with an electron beam; a detection circuit acquires a first inspection image generated from the first pattern by irradiation; a filter circuit that performs smoothing using a local region having a first size in a direction parallel to a first outline included in the first inspection image and a second size smaller than the first size in a direction perpendicular to the first outline and acquires a second inspection image including a second outline generated by the smoothing; and a comparison circuit that compares the second inspection image with a predetermined reference image.

Herein, description of contents overlapping with the first to third embodiments will be omitted.

FIGS. 15A to 15E are schematic cross-sectional views illustrating a method of manufacturing the first pattern used in the present embodiment.

Figure 15A:
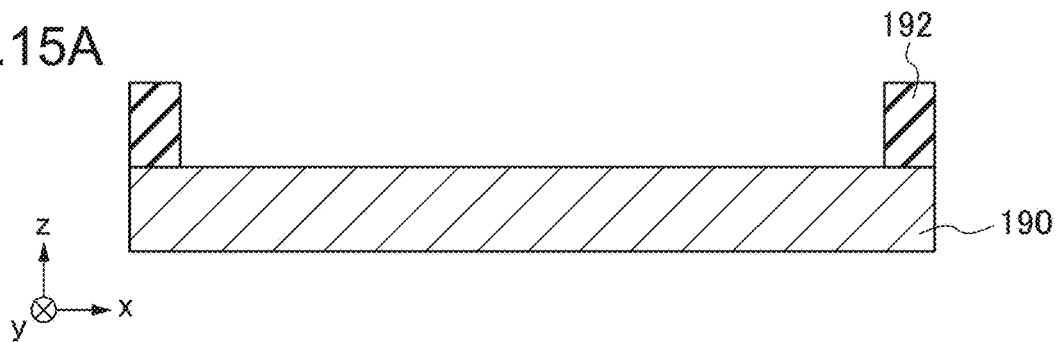
FIGS. 15A to 15E are schematic cross-sectional views illustrating a method of manufacturing a first pattern used in a fourth embodiment.

First, guide patterns 192 are formed on a substrate (wafer) 190 by using a resist material (FIG. 15A).

Figure 15B:
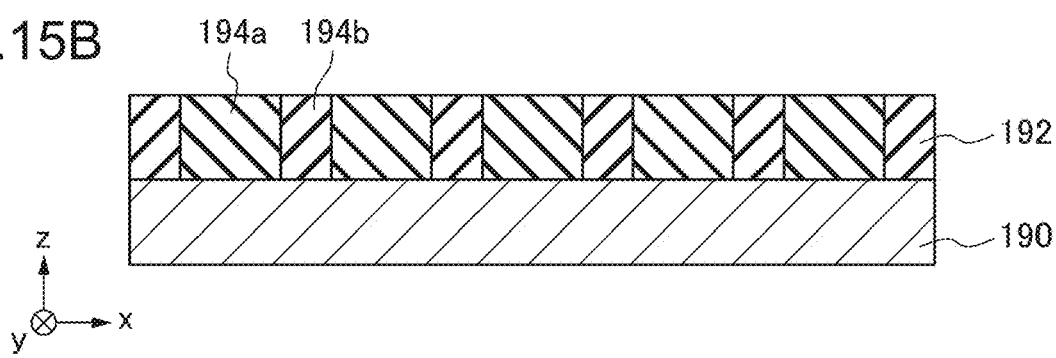
Figure 15C:
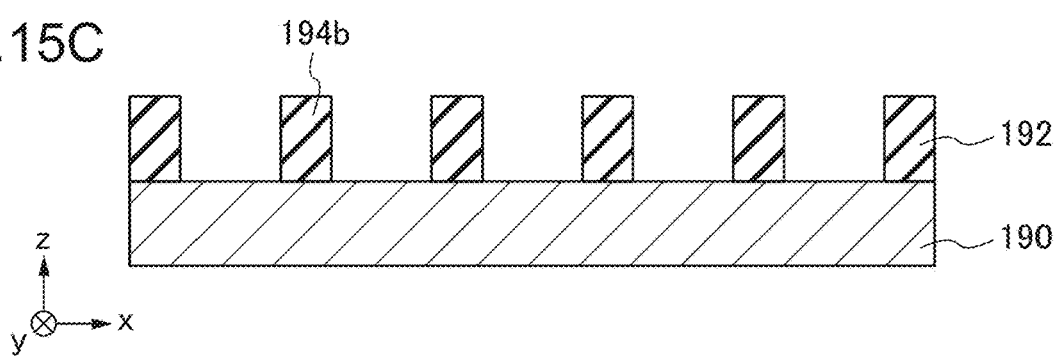
Figure 15D:
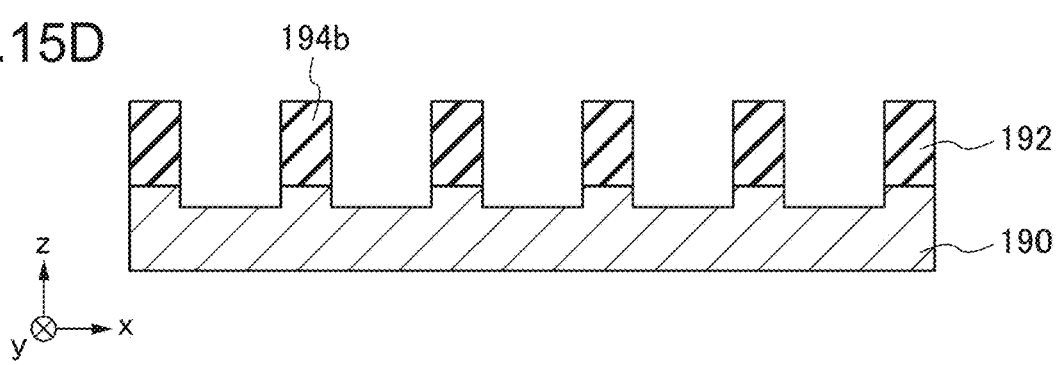

Next, a diblock copolymer is applied on the substrate 190 between the guide patterns 192 and heat-treated to form a portion made of a polymer 194a having a low etching resistance and a portion made of a polymer 194b having a high etching resistance (FIG. 15B). As the diblock copolymer, for example, polystyrene-polymethylmethacrylate (PMMA) is preferably used, but the diblock copolymer is not limited thereto.

Figure 15E:
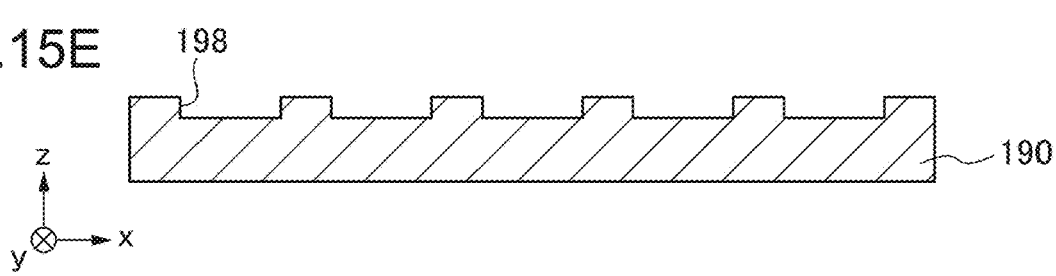

Next, a polymer 194a and a portion of the substrate 190 are removed by etching (FIGS. 15C and 15D) to obtain the substrate 190 having a first pattern 198 (FIG. 15E). The first pattern 198 obtained herein is, for example, a line-and-space pattern extending in the y direction.

The inspection apparatus and the inspection method according to the present embodiment can be preferably applied to the first pattern formed by self-assembly lithography.

In the self-assembly lithography, there is generally a roughness and a minimum period of a defect to appear, and thus, it is preferable to arbitrarily set the first size so as to conform to the minimum period. Similarly to the first to third embodiments, the second size is preferably set to about the beam diameter of the electron beam used for inspection. As a result, only the noise is reduced by filtering without impairing the sharpness of the edge, and a highly accurate outline can be extracted, so that defects can be detected with a high accuracy.

Fifth Embodiment

An inspection apparatus according to the present embodiment includes an irradiation source which allows a first pattern formed on a photomask, which is an inspection target object, to be irradiated with an electron beam, a detection circuit which acquires a first inspection image generated from the first pattern by the irradiation, a filter circuit which performs smoothing using a local region having a first size in a direction parallel to a first outline included in the first inspection image and having a second size smaller than the first size in a direction perpendicular to the first outline and acquire a second inspection image including a second outline generated by the smoothing, and a comparison circuit which compares the second inspection image with a predetermined reference image.

Then, the photomask of the present embodiment is, for example, an EUV mask having an absorber (light-shielding film), on which the first pattern is formed, which is provided on a reflective film made of a multi-layer film in which an Si film containing Si (silicon) and an Mo film containing Mo (molybdenum) are stacked on a glass substrate. Herein, description of contents overlapping with the first to fourth embodiments will be omitted.

Figure 16:
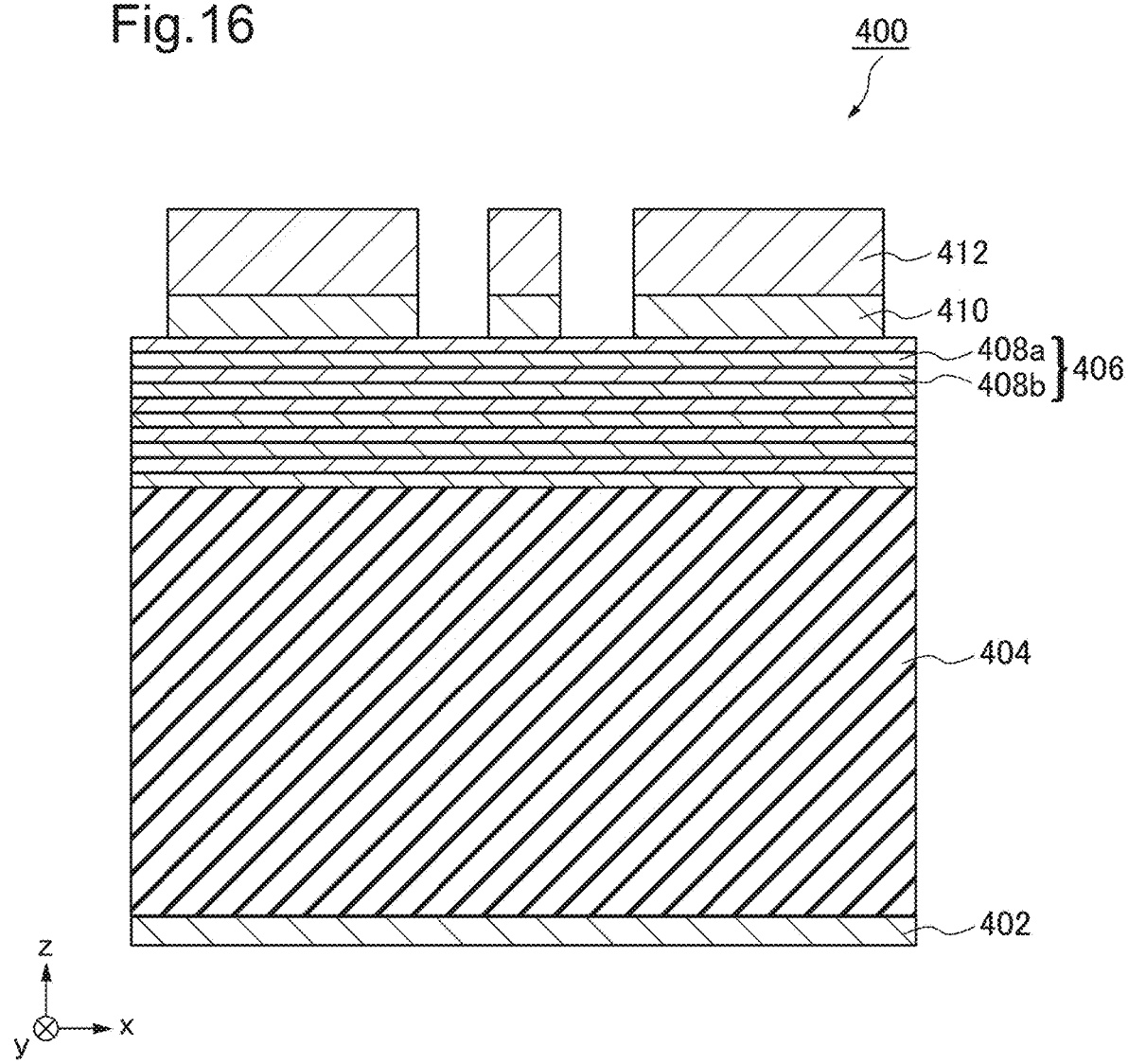
FIG. 16 is a schematic sectional view of an EUV mask used in a fifth embodiment.

FIG. 16 is a schematic sectional view of an EUV mask 400 used in the present embodiment.

The EUV mask 400 includes a conductive film 402, a glass substrate 404, a reflective film 406, a buffer layer 410, and an absorber 412.

As the glass substrate 404, for example, a substrate using synthetic quartz or a substrate using extremely low thermal expansion glass having a smaller coefficient of thermal expansion than quartz is preferably used in order to suppress thermal distortion during the exposure.

The reflective film 406 is provided on the glass substrate 404. The reflective film 406 is configured with a multi-layer film in which for example, about 40 cycles or more and 60 cycles or less of an Si film 408a and an Mo film 408b are stacked. In addition, in FIG. 16, the number of layers of the Si film 408a and the Mo film 408b is omitted in illustration.

The buffer layer 410 is provided on the reflective film 406. The buffer layer 410 contains, for example, Ru (ruthenium). The buffer layer 410 is provided to protect the reflective film 406 at the time of etching the absorber 412 described later and at the time of correcting defects of the absorber 412.

The absorber 412 is provided on the buffer layer 410. When viewed in a plane parallel to the substrate surface of the glass substrate 404, a pattern to be transferred onto the wafer is formed on the absorber 412 and the buffer layer 410. This is a first pattern 414.

The conductive film 402 is provided on the back surface of the glass substrate 404 where the first pattern 414 is not provided. In other words, the glass substrate 404 is provided between the conductive film 402 and the reflective film 406. The conductive film 402 is provided for fixing the EUV mask 400 to an electrostatic chuck (not illustrated). The conductive film 402 contains, for example, CrN (chromium nitride).

When irradiated with EUV light, the portion where the absorber 412 is added absorbs light, and the portion where the reflective film 406 is exposed reflects light. For this reason, the first pattern can be transferred onto the wafer by the EUV exposurer. In addition, the wavelength region of EUV light is easily absorbed by the material, and thus, a lens using light refraction cannot be used. For this reason, the projection optical systems are all configured with reflection optical systems. Therefore, the EUV mask is also a reflective mask as described above.

The inspection apparatus and the inspection method according to the present embodiment can be preferably applied to the first pattern formed as described above.

Unlike in lithography using an exposurer, in photomask, it is not possible to determine the minimum period of roughness due to the resolution of the exposurer. However, it is possible arbitrarily determine the first size without any problem even if the smoothing is applied by roughness due to the process, the assumed defect size, or the like. In addition, with respect to the second size, similarly to the first embodiment, it is possible to select an appropriate value of about the beam diameter of the electron beam used for inspection.

In the above description, a series of "circuits" includes processing circuits, and the processing circuits include an electric circuit, a computer, a processor, a circuit board, a quantum circuit, a semiconductor device, or the like. In addition, a common processing circuit (same processing circuit) may be used for each "circuit". Alternatively, different processing circuits (separate processing circuits) may be used. A program for executing a processor or the like may be recorded on a recording medium such as a magnetic disk drive, a magnetic tape device, an FD, or a read only memory (ROM). In addition, a "memory unit", a "storage unit", or a memory device includes, for example, a recording medium such as a magnetic disk drive, a magnetic tape device, an FD, a ROM (read only memory), or a solid state drive (SSD).

Heretofore, the embodiments have been described with reference to specific examples. The above-described embodiments are merely examples and do not limit embodiments. In addition, the constituent elements of each embodiment may be appropriately combined.

In the embodiments, the configurations of the inspection method and the inspection apparatus, the manufacturing methods thereof, and the like, which are not directly necessary for the description of embodiments are omitted in description. However, as necessary, the configuration of the inspection method may be appropriately selected and used. In addition, all the inspection methods that include the elements of embodiments and can be appropriately changed in design by those skilled in the art are included in the scope of embodiments. The scope of embodiments is defined by the claims and their equivalents.

What is claimed is:

1. An inspection apparatus comprising:
   an irradiation source irradiating a first pattern formed on an inspection target object with an electron beam;
   a detection circuit acquiring a first inspection image generated from the first pattern by irradiation;
   a filter circuit performing smoothing of a local region having a first size in a direction parallel to a first outline included in the first inspection image and a second size smaller than the first size in a direction perpendicular to the first outline and acquiring a second inspection image including a second outline generated by the smoothing, wherein the local region is a convolutional kernel of the smoothing performed by the filter circuit; and
   a comparison circuit comparing the second inspection image with a predetermined reference image,
   wherein the filter circuit performs the smoothing by a filter using the local region and a predetermined guide image generated by applying a Gaussian filter and acquires the second inspection image including the second outline generated by the smoothing.

2. The inspection apparatus according to claim 1, wherein the filter is a joint bilateral filter.

3. The inspection apparatus according to claim 1,
   wherein the inspection target object is a wafer,
   wherein the first pattern is formed by transferring a second pattern of a photomask onto the wafer by using an exposing apparatus, and
   wherein the first size is substantially equal to a resolution of the exposing apparatus.

4. The inspection apparatus according to claim 1,
   wherein the inspection target object is a wafer,
   wherein the first pattern is formed by transferring a second pattern of a photomask onto the wafer by using an exposing apparatus, and
   wherein the first size is equal to a full width at half maximum of $1/3$ times or more and 1 time or less quotient ($\lambda/(NA)$) of a wavelength ($\lambda$) and a numerical aperture (NA) of the exposing apparatus.

5. The inspection apparatus according to claim 3, further comprising a guide image generation circuit generating the predetermined guide image by applying a Gaussian filter to design data of the second pattern.

6. The inspection apparatus according to claim 1, further comprising a guide image generation circuit generating the predetermined guide image by applying a Gaussian filter to the first inspection image.

7. The inspection apparatus according to claim 1, wherein the second size is substantially equal to a beam diameter of the electron beam.

8. The inspection apparatus according to claim 1, wherein the second size is greater than or equal to ½ of a full width at half maximum of a beam diameter of the electron beam and is less than or equal to the full width at half maximum of the beam diameter of the electron beam.

9. The inspection apparatus according to claim 1, further comprising an outline extraction circuit extracting the second outline from the second inspection image,
wherein the comparison circuit compares the second inspection image with the predetermined reference image by comparing the second outline with a reference outline included in the predetermined reference image.

10. An inspection method, comprising:
irradiating a first pattern formed on an inspection target object with an electron beam;
acquiring a first inspection image generated from the first pattern by irradiation;
performing smoothing of a local region having a first size in a direction parallel to a first outline included in the first inspection image and a second size smaller than the first size in a direction perpendicular to the first outline and acquiring a second inspection image including a second outline generated by the smoothing, wherein the local region is a convolutional kernel of the smoothing; and
comparing the second inspection image with a predetermined reference image,
wherein the smoothing is performed by a filter using the local region and a predetermined guide image generated by applying a Gaussian filter, and the second inspection image including the second outline generated by the smoothing is acquired.

11. The inspection method according to claim 10, wherein the filter is a joint bilateral filter.

12. The inspection method according to claim 10,
wherein the inspection target object is a wafer,
wherein the first pattern is formed by transferring a second pattern of a photomask onto the wafer by using an exposing apparatus, and
wherein the first size is substantially equal to a resolution of the exposing apparatus.

13. The inspection method according to claim 10,
wherein the inspection target object is a wafer,
wherein the first pattern is formed by transferring a second pattern of a photomask onto the wafer by using an exposing apparatus, and
wherein the first size is equal to a full width at half maximum of ⅓ times or more and 1 time or less quotient ($\lambda/(NA)$) of a wavelength ($\lambda$) and a numerical aperture (NA) of the exposing apparatus.

14. The inspection method according to claim 12, wherein the predetermined guide image is generated by applying a Gaussian filter to design data of the second pattern.

15. The inspection method according to claim 10, wherein the predetermined guide image is generated by applying a Gaussian filter to using the first inspection image.

16. The inspection method according to claim 10, wherein the second size is substantially equal to a beam diameter of the electron beam.

17. The inspection method according to claim 10, wherein the second size is greater than or equal to ½ of a full width at half maximum of a beam diameter of the electron beam and is less than or equal to the full width at half maximum of the beam diameter of the electron beam.

18. The inspection method according to claim 10, wherein the second inspection image is compared with the predetermined reference image by comparing the second outline with a reference outline included in the predetermined reference image.

* * * * *